United States Patent
Ohgushi et al.

(10) Patent No.: US 6,891,172 B2
(45) Date of Patent: May 10, 2005

(54) DIFFERENTIAL PUMPING SYSTEM AND EXPOSURE APPARATUS

(75) Inventors: Nobuaki Ohgushi, Tochigi (JP); Akira Miyake, Tochigi (JP); Takayuki Hasegawa, Tokyo (JP); Jun Ito, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/652,690

(22) Filed: Aug. 28, 2003

(65) Prior Publication Data

US 2004/0046949 A1 Mar. 11, 2004

(30) Foreign Application Priority Data

Sep. 3, 2002 (JP) ........................................ 2002-258087
Apr. 11, 2003 (JP) ........................................ 2003-107771

(51) Int. Cl.[7] .............................................. A61N 5/00
(52) U.S. Cl. ................. 250/492.2; 250/493.1; 250/504 R; 250/365; 250/372
(58) Field of Search ......................... 250/504 R, 492.2, 250/493.1; 378/119, 34, 504 R, 365, 372

(56) References Cited

U.S. PATENT DOCUMENTS

| | | | | |
|---|---|---|---|---|
| 4,837,794 A | * | 6/1989 | Riordan et al. | ............. 378/119 |
| 4,860,328 A | * | 8/1989 | Frankel et al. | ............... 378/34 |
| 4,996,700 A | | 2/1991 | Yamashita et al. | |
| 5,305,364 A | | 4/1994 | Mochiji et al. | |
| 5,491,534 A | | 2/1996 | Shiozawa | |
| 5,699,148 A | | 12/1997 | Shiozawa | |
| 5,846,678 A | | 12/1998 | Nishigori et al. | |
| 6,291,831 B1 | * | 9/2001 | Koren | ........................ 250/584 |
| 6,459,472 B1 | * | 10/2002 | De Jager et al. | ............. 355/68 |
| 6,538,257 B2 | * | 3/2003 | Bisschops | ................ 250/493.1 |
| 2002/0090054 A1 | * | 7/2002 | Sogard | ....................... 378/119 |
| 2003/0006383 A1 | * | 1/2003 | Melnychuk et al. | .... 205/504 R |
| 2004/0013226 A1 | | 1/2004 | Bakker et al. | |
| 2004/0075063 A1 | * | 4/2004 | Hasegawa et al. | ........ 250/492.1 |

FOREIGN PATENT DOCUMENTS

| | | | | |
|---|---|---|---|---|
| EP | 001396760 A2 | * | 10/2004 | ............. G03F/7/20 |
| JP | 2-156200 | | 6/1990 | |
| JP | 5-82417 | | 4/1993 | |
| JP | 7-74092 | | 3/1995 | |
| JP | 7-263322 | | 10/1995 | |
| JP | 8-179514 | | 7/1996 | |
| JP | 2003-318107 | | 11/2003 | |

OTHER PUBLICATIONS

English Abstract for 07–263322 (Item A).

* cited by examiner

*Primary Examiner*—Nikita Wells
*Assistant Examiner*—Jonnie L Smith, II
(74) *Attorney, Agent, or Firm*—Morgan & Finnegan, LLP

(57) ABSTRACT

A differential pumping system includes a first chamber for storing a light source that emits pulsed light, a first exhaust unit for exhausting said first chamber, a second chamber being connectible to the first chamber to receive the pulsed light, a second exhaust unit for exhausting said second chamber, and a connection control mechanism between the first and second chambers for connecting the first chamber to the second chamber when the pulsed light emits, and for disconnecting the first chamber from the second chamber when the pulsed light does not emit.

22 Claims, 25 Drawing Sheets

DIFFERENTIAL PUMPING SYSTEM AND EXPOSURE APPARATUS

This application claims a benefit of priority based on Japanese Patent Applications Nos. 2002-258087, filed on Sep. 6, 2002, and 2003-107771, filed on Apr. 11, 2003, each of which is hereby incorporated by reference herein in its entirety as if fully set forth herein.

BACKGROUND OF THE INVENTION

The present invention relates to exposure apparatuses that exposes an object, such as a single crystal substrate for a semiconductor wafer, and a glass plate for a liquid crystal display ("LCD"). The present invention is particularly suitable, for example, for an exposure apparatus that uses ultraviolet light and extreme ultraviolet ("EUV") light as a light source for exposure.

In manufacturing such a fine semiconductor device as a semiconductor memory and a logic circuit in photolithography technology, a reduction projection exposure apparatus has been conventionally employed which uses a projection optical system to project a circuit pattern formed on a mask (reticle) onto a wafer, etc. to transfer the circuit pattern.

The minimum critical dimension to be transferred by the projection exposure apparatus or resolution is proportionate to a wavelength of light used for exposure, and inversely proportionate to the numerical aperture ("NA") of the projection optical system. The shorter the wavelength is, the better the resolution is. Along with recent demands for finer semiconductor devices, a shorter wavelength of ultraviolet light has been promoted from an ultra-high pressure mercury lamp (such as i-line with a wavelength of approximately 365 nm) to KrF excimer laser (with a wavelength of approximately 248 nm) and ArF excimer laser (with a wavelength of approximately 193 nm).

However, the photolithography using the ultraviolet light has the limit to satisfy the rapidly promoting fine processing of a semiconductor device, and a reduction projection optical apparatus using the EUV light with a wavelength of 10 to 15 nm shorter than that of the ultraviolet light (referred to as "EUV exposure apparatus") has been developed to efficiently transfer a very fine circuit pattern of 0.1 $\mu$m or less.

The EUV light source uses, for example, a laser plasma light source. It irradiates a highly intensified pulse laser beam to a target material put in a vacuum chamber to generate high-temperature plasma for use as the EUV light with a wavelength of about 13 nm emitted from this. The target material may use Xe gas, droplets, and clusters, and a metallic thin film, such as copper, tin, aluminum, etc., and is supplied to the vacuum chamber by gas jetting means and other means.

The laser plasma as one mode of the EUV light source irradiates the high-strength pulse laser light onto the target material and generates not only the EUV light from the target material, but also flying particles called debris, which causes contamination, damages and lowered reflectivity of an optical element. Accordingly, a method have been conventionally proposed which mitigates influence of debris by providing a foil trap made of a porous material around the target material and circulating inert gas, such as He gas, as buffer gas.

Since He gas as well as Xe gas as the target material is essential to a light emitting section of the target material, the pressure in a vacuum chamber becomes about 10 Pa although a vacuum pump exhausts the chamber. The atmosphere of a stage subsequent to the light emitting section should be maintained as clean as possible, preferably with the degree of vacuum of about $10^{-7}$ Pa, for intended performance such as reflectivity of the optical element, since the EUV light has low transmittance to the air and contaminates an optical element when reacted with a residual gas component (such as high molecule organic gas).

Differential pumping system have already been proposed which use a thin film window provided between a light emitting section and an optical element in a stage subsequent to the light emitting section (as seen in Japanese Patent Applications Publications Nos. 5-82417 and 2-156200 corresponding to U.S. Pat. Nos. 5,305,364, and 4,996,700). Several proposals of exposure dose control over a pulsed light source may be seen in Japanese Patent Applications Publications Nos. 7-74092 and 8-179514 corresponding to U.S. Pat. Nos. 5,491,534, 5,699,148 and 5,846,678.

It is difficult to manufacture and handle a self-supported filter material that has high transmittance and is applicable to a wavelength range of the EUV light. A differential pumping method is conceivable, as shown in FIG. 23, which uses a channel or orifice 3900 for differential pumping at a connection between a light source chamber 3110 that accommodates a light emitting section and an illumination system chamber 3120 that stores an optical element 3500. Here, FIG. 23 is a schematic structure of an EUV light source 3000 that uses a laser plasma light source.

The differential pumping using the orifice generates a pressure difference of about $10^{-2}$ Pa between the light source chamber 3110 and an illumination system chamber 3120. When it is considered that the light source chamber 3110 has the pressure of about 10 Pa as discussed, the pressure in the illumination system 3120 becomes about $10^{-1}$ Pa, which is insufficient to maintain the performance such as the reflectivity of the optical element 3500.

In order to obtain a desired pressure difference between the light source chamber 3110 and the illumination system 3120, it is conceivable to elongate the channel 3900 that connects the light source chamber 3110 and the illumination system chamber 3120. On the other hand, for enhanced use efficiency of the EUV light 3400, a spheroid condenser mirror 3600 should capture the EUV light generated from the target material as much as possible, for example, at about Π steradian. However, as the capture angle becomes large, it becomes difficult to elongate the channel 3900 and to obtain a desired pressure difference.

A demand to maintain the pressure in the illumination system chamber to be the degree of vacuum of about $10^{-7}$ Pa is common to a discharge method that generates the EUV light by circulating Xe gas, etc. in an electrode for discharging and generating plasma, as well as the laser plasma method.

When a turbo molecular pump is provided in series of a beam line of radiation light and an aperture part that allows the light to pass is provided in a stator and rotor in the turbo molecular pump, as disclosed in Japanese Patent Application Publication No. 2-156200 corresponding to U.S. Pat. No. 4,996,700, it is difficult to efficiently pick up pulsed light that oscillates at high frequency. Thus, it is a very difficult issue to increase the use efficiency of the EUV light while achieving the intended pressure difference in a differential pumping.

BRIEF SUMMARY OF THE INVENTION

Accordingly, it is an exemplary object of the present invention to provide a differential pumping system and an exposure apparatus having the same, in which the use efficiency of the high pulsed light is compatible with the differential pumping having an intended pressure difference so as to maintain performance of an optical element, such as reflectivity.

A differential pumping system of one aspect according to the present invention includes a first chamber for storing a light source that emits first pulsed light, a first exhaust unit for exhausting said first chamber, a second chamber being connectible to the first chamber to receive the pulsed light, a second exhaust unit for exhausting said second chamber, and a connection control mechanism between the first and second chambers for connecting the first chamber to the second chamber when the pulsed light emits, and for disconnecting the first chamber from the second chamber when the pulsed light does not emit.

The connection control mechanism may include a rotator that rotates around an axis, and includes an aperture part through which the pulsed light passes, and a shield part for disconnecting the first chamber from the second chamber, and a controller for synchronously controlling emissions of the pulsed light and a rotation of said rotator so that the pulse beam may pass through the aperture part. The rotator may be a disc or cylindrical member that rotates around the axis. The differential pumping system may further include a third exhaust unit for exhausting the cylindrical member. The rotator may include a pattern for detecting a rotational status, and said controller uses the rotational status detected from the pattern. The differential pumping system may further include a shutter for preventing the pulsed light from entering said rotator when an emission of the pulsed light is not synchronized with a rotation of the rotator. The pulsed light may be EUV light.

A differential pumping system of another aspect according to the present invention includes a first chamber for storing a light source that emits pulsed light, a second chamber being connectible to the first chamber to receive the pulsed light, and a vacuum pump, provided between the first and second chambers, for exhausting an atmosphere of the second chamber toward the first chamber, said vacuum pump including a rotor, wherein the rotor includes an aperture part, through which the pulsed light passes, and wherein the pulsed light is introduced from the first chamber to the second chamber by synchronizing emissions of the pulsed light and a rotation of said rotor. The differential pumping system may further include a stator which includes another aperture part through which the pulsed light passes. The vacuum pump may include plural rotors arranged in series, and the pulsed light forms light having a condensed point, wherein a central rotor among the plural rotors is located at a side from the condensed point to the second chamber. The differential pumping system may further include a shutter for preventing the pulsed light from entering said rotor when an emission of the pulsed light is not synchronized with a rotation of the rotor. The pulsed light may be EUV light.

An exposure apparatus of another aspect according to the preset invention includes the above differential pumping system, an illumination optical system that introduces the pulsed light to a mask that forms a circuit pattern to be transferred onto an object, a projection optical system that introduces the light from the mask onto the object, wherein said illumination optical system and projection optical system are installed in the second chamber.

A measurement apparatus of another aspect according to the present invention includes the above differential pumping system, a light intensity measuring apparatus for measuring light intensity from an object to be measured, an illumination optical system that introduces the pulsed light to the object, a projection optical system that introduces the light from the object to said light intensity measuring apparatus, wherein said light intensity measuring apparatus, illumination optical system and projection optical system are installed in the second chamber.

A device fabrication method of another aspect of this invention includes the steps of exposing a plate by using the above exposure apparatus, and performing a predetermined process for the exposed object. Claims for a device fabrication method for performing operations similar to that of the above exposure apparatus cover devices as intermediate and final products. Such devices include semiconductor chips like an LSI and VLSI, CCDs, LCDs, magnetic sensors, thin film magnetic heads, and the like.

A control method of another aspect according to the present invention for controlling a rotation of a rotator in a differential pumping system that includes a first chamber for storing a light source that emits pulsed light, a second chamber being connectible to the first chamber and receiving the pulsed light, and the rotator, provided between the first and second chambers, which includes an aperture part through which the pulsed light passes when the pulsed light emits, and a shield part for disconnecting the first chamber from the second chamber when the pulsed light does not emits, includes the steps of dividing a reference clock as a trigger signal of the pulsed light, and generating a reference signal for the rotation of the rotator, calculating a phase difference signal from the reference signal and a divided signal so that the rotation of the rotator has the same frequency as that of the reference signal, calculating a phase difference from the reference signal and the phase difference signal, and rotating the rotator so that the phase difference is a phase set value.

Other objects and further features of the present invention will become readily apparent from the following description of the preferred embodiments with reference to accompanying drawings.

DETAILED DESCRIPTION OF THE PREFERRED EMBODIMENTS

Figure 1:
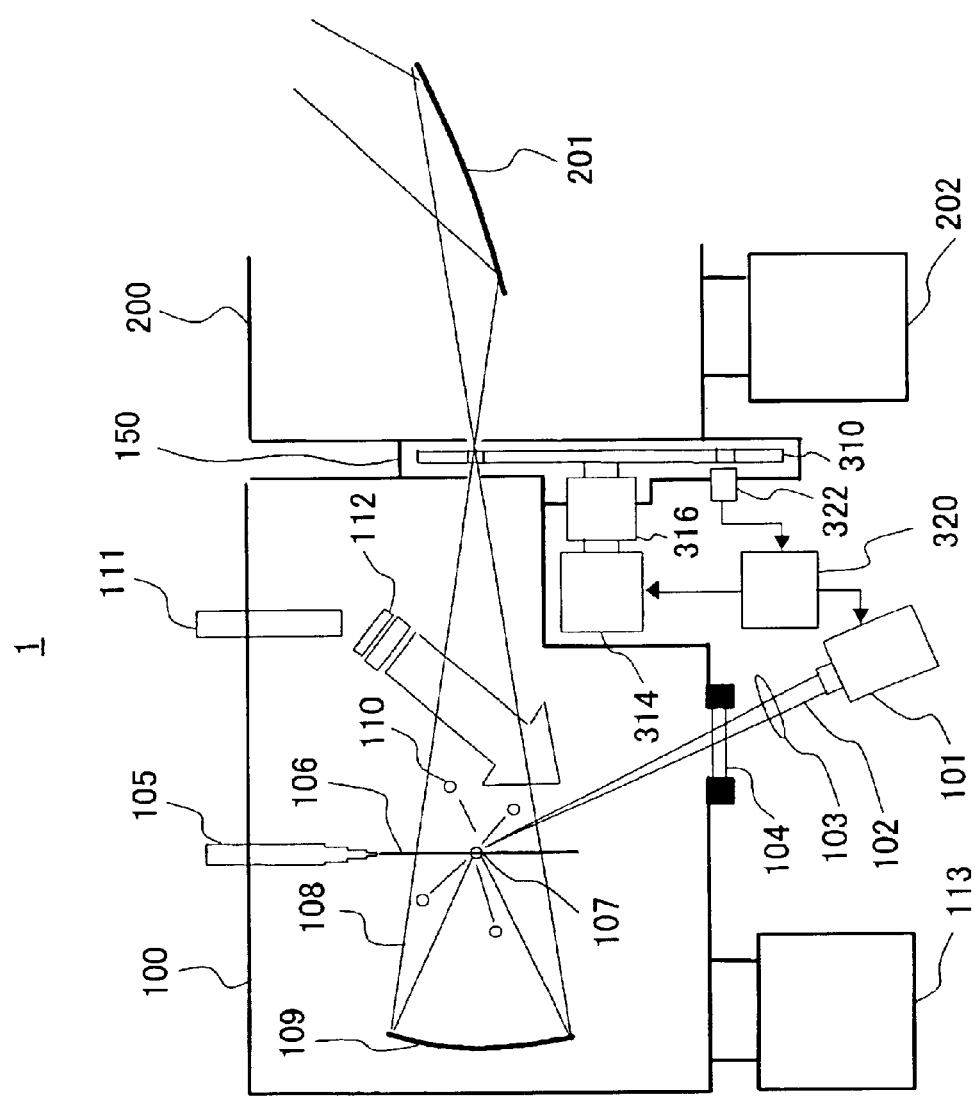
FIG. 1 is a schematic structure of a differential pumping system as one aspect according to the present invention.

With reference to accompanying drawings, a description will now be given of a differential pumping system 1 of one embodiment according to the present invention. In each figure, the same element is designated by the same reference numeral, and a description thereof will be omitted. Here, FIG. 1 is a schematic structure of the differential pumping system 1.

Referring to FIG. 1, the differential pumping system 1 maintains the pressure of an illumination system chamber 200 that is connectible to a light source chamber 100, smaller than that of the light source chamber 100 that accommodates plasma 107 as a light source for emitting pulsed light. The differential pumping system 1 includes a channel part 150 that introduces EUV light 108 as the pulsed light emitted from the plasma 107 into the illumination system chamber 200, and a connection control mechanism 300 for connecting the light source chamber 100 to the illumination system chamber 200 when the plasma 107 emits and for disconnecting the light source chamber 100 from the illumination system chamber 200 when the plasma 107 does not emit.

Pulsed laser 102 exited from a laser generator 101 is condensed on a target 106, such as Xe gas, supplied from a nozzle 105 via a condenser lens 103 and a transmission window 104, generating the plasma 107. The plasma 107 irradiates the EUV light 108, and a spheroid condenser mirror 109 condenses the EUV light 108 for improved use efficiency, and introduces it, via the channel part 105, into the illumination system chamber 200 that accommodates an optical element 201.

As discussed, the plasma 107 generates not only the EUV light 108 but also flying particles called debris 110, which splashes and causes contamination, damages and lowered reflectivity of the condenser mirror 109 and the neighboring optical element 201. Accordingly, a buffer gas supply unit 111 introduces He gas 112 into the light source chamber 100 to mitigate flying of the debris 110 using flows of the He gas 112.

In order to reduce attenuation of the EUV light 108 and contamination and damages of the condenser mirror 109, the Xe gas as a target 106 and the He gas 112 as buffer gas are always supplied to the light source chamber 100 while a vacuum pump 113 exhausts the chamber 100. Therefore, the pressure of the light source chamber 100 becomes about 10 Pa. The condenser mirror 109 is configured to be easily replaceable, since the condenser mirror 109 is gradually contaminated and damaged at about 10 Pa, lowering reflectivity.

On the other hand, it is preferable not to replace the optical element 201 accommodated in the illumination system chamber 200, and the illumination system chamber 200 is always exhausted by a vacuum pump 202 so that its pressure is below $10^{-2}$ Pa. In order for the differential pumping to realize a pressure difference of $10^3$ Pa or greater, the channel part 150 must be elongated which connects the light source chamber 100 to the illumination system chamber 200. On the contrary, a large capture angle is necessary for the condenser mirror 109 to capture the EUV light 108 efficiently, and is not compatible with the elongated channel part 105.

Figure 2:
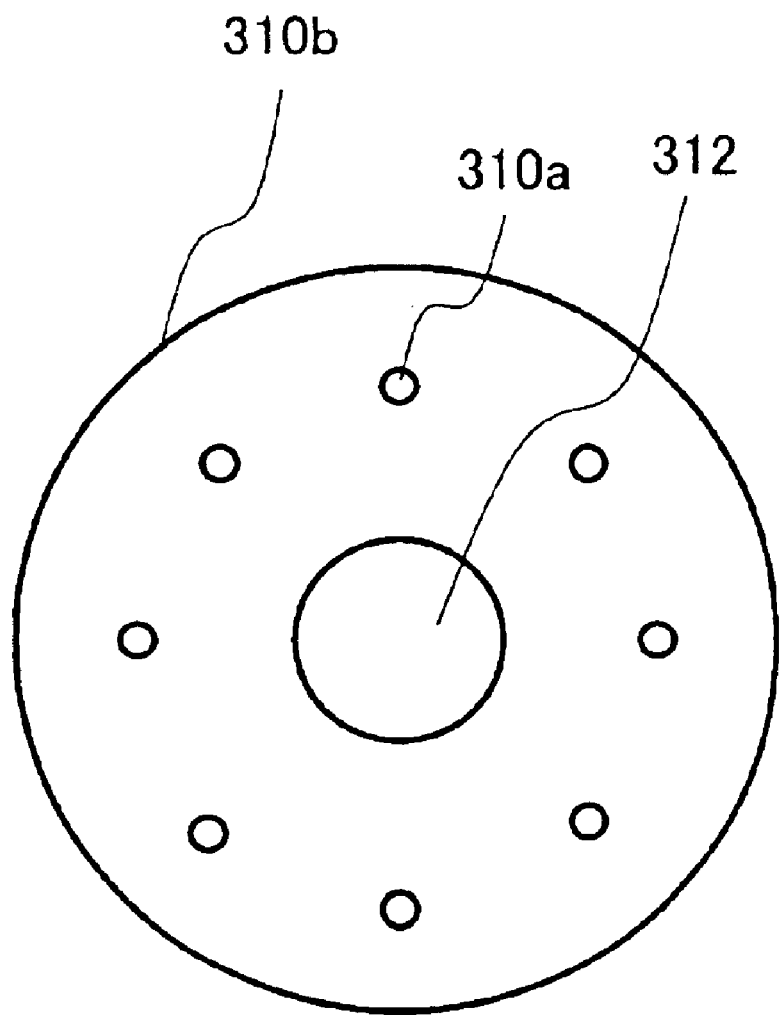
FIG. 2 is a schematic plane view showing one example of a disc shown in FIG. 1.

Taking into account the fact that the EUV light 108 is the pulsed light, the differential pumping system 1 is arranged in the channel part 150 so that it rotates around a shaft 312, and includes, as shown in FIG. 2, an aperture part 310a through which the EUV light 108 passes, and a shield part 310b that disconnects the light source chamber 100 from the illumination system chamber 200.

A disc 310 is driven by a motor 314, such as a DC motor, an AC motor, and a pulse motor, which is provided outside the light source chamber 100 and the illumination system chamber 200. A magnetic fluid seal bearing 316 handles the power transmission from the air side to the vacuum side.

A controller 320 monitors a rotational status of the disc 310, and outputs a trigger in synchronization with the rotation to the laser generator 101 to realize a synchronization of the EUV light 108 with the disc 310.

For example, if it is assumed that the laser generator 101 has the emission frequency of 6 kHz, the disc 310 has eight aperture parts 310a, the EUV light 108 may be obtained without being shielded by the shield part 310b when the disc 310 is rotated at 6000/8=750 (rps)=45,000 (rpm) and emissions from the laser generator 101 is adjusted to phases.

Figure 3:
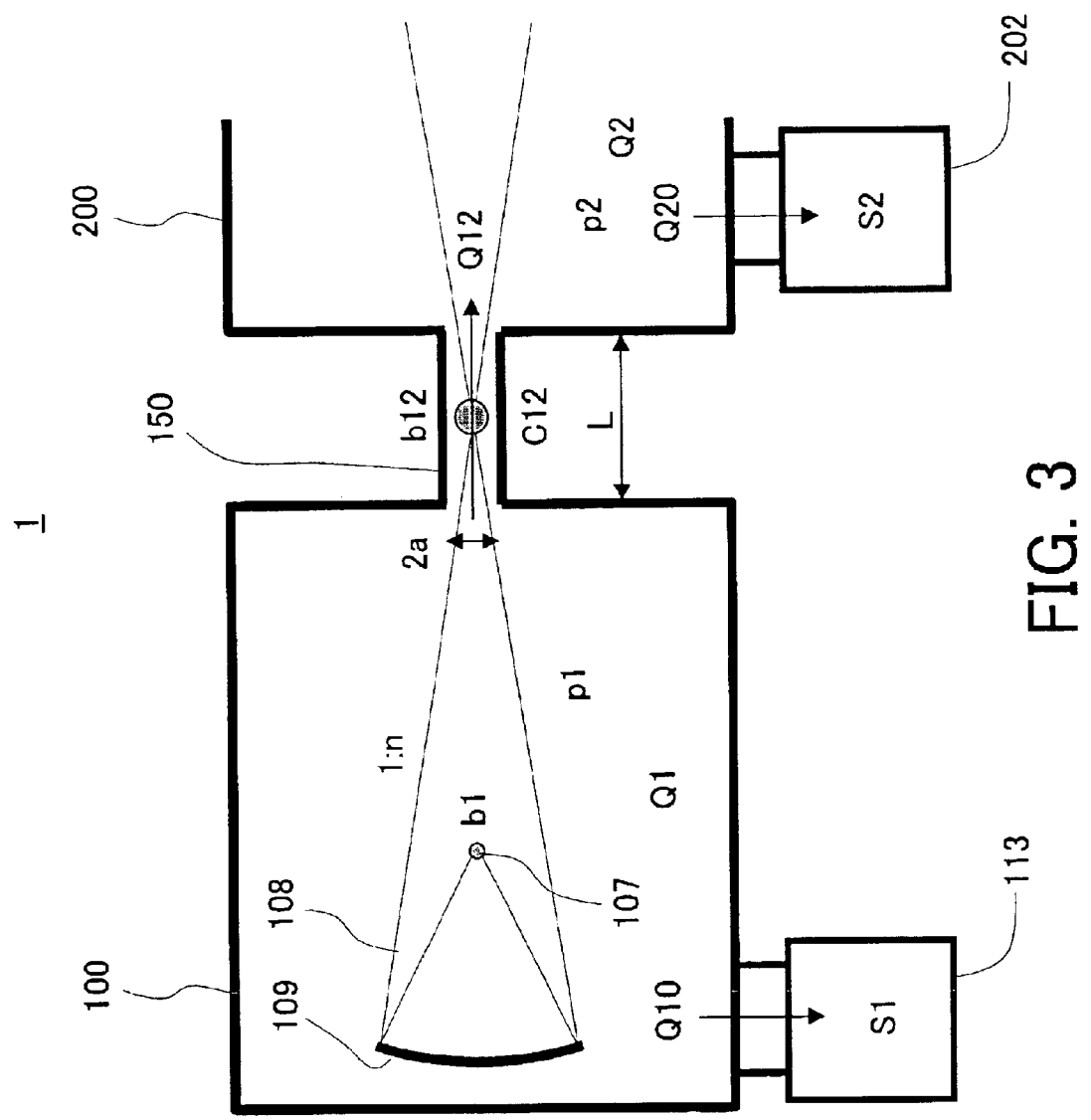
FIG. 3 is a view for explaining a design example of a usual differential pumping system.

FIG. 3 is an explanatory view of a design example of a usual differential pumping system. Referring to FIG. 3, the following equations are met where p1 (Pa) is the pressure of the light source chamber 100, p2 (Pa) is the pressure of the illumination system chamber 200, S1 ($m^3/s$) is a pumping speed at which the vacuum pump 113 exhausts the light source chamber 100, S2 ($m^3/s$) is a pumping speed at which the vacuum pump 202 exhausts the illumination system chamber 200, C12 ($m^3/s$) is conductance of the channel part 150 that connects the light source chamber 100 to the illumination system chamber 200, Q1 (Pa·m³/s) is degas amount generated from the light source chamber 100, Q2 (Pa·m³/s) is degas amount generated from the illumination system chamber 200, Q10 (Pa·m³/s) and Q20 (Pa·m³/s) are flow rate exhausted by respective vacuum pumps 113 and 202, and Q12 (Pa·m³/s) is the flow rate that flows through the channel part 150:

$$Q1+Q2=Q10+Q20 \quad (1)$$

$$Q20=Q12+Q2 \quad (2)$$

$$Q10=S1 \cdot p1 \quad (3)$$

$$Q20=S2 \cdot p2 \quad (4)$$

$$Q12=C12 \cdot (p1-p2) \quad (5)$$

Equations 6 and 7 are obtained as follows from Equations 1 to 5 by deleting Q10, Q20 and Q12 and simplifying Q1>>Q2, S1 and S2>>C12:

$$p1=(C12 \cdot Q1+S2 \cdot Q1+C12 \cdot Q2)/(C12 \cdot S1+C12 \cdot S2+S1 \cdot S2) \approx Q1/S1 \quad (6)$$

$$p2=(C12 \cdot Q1+C12 \cdot Q2+S1 \cdot Q2)/(C12 \cdot S1+C12 \cdot S2+S1 \cdot S2) \approx (C12 \cdot Q1+S1 \cdot Q2)/(S1 \cdot S2) \quad (7)$$

For the pressure $p1=10$ (Pa), the pumping speed $S1=S2=1$ (m³/s), the degas amounts $Q1=10$ (Pa·m³/s) and $Q2=10^{-5}$ (Pa·m³/s), then $p2=10 \cdot C12+10^{-5} \leq 10^{-2}$ (Pa) is necessary to suffice $p1/p2 \geq 1000$ in Equation 7, which leads to Equation 8:

$$C12 \leq 10^{-3} \quad (8)$$

The conductance of the channel part 150 should be less than 1/1000 times the pumping speed of the vacuum pump 202 connected to the illumination system chamber 200. The simplified equation of the conductance C12 is expressed by Equation 9 where the channel part 150 has a radius "a" (m) and a length L (m):

$$C12 \approx 10^3 \cdot a^3/L \quad (9)$$

From Equations 8 and 9, the length L (m) of the channel part 150 is expressed as in Equation 10:

$$L \geq 10^6 \cdot a^3 \quad (10)$$

For a condenser system of 1:n where b1 is a beam size at an emission point, a beam size b12 at the channel part 150 becomes n·b1. For example, for the condenser system of 1:4 and b1=0.2 (mm), the beam size b12 at the channel part 150 becomes 0.8 (mm). When the condenser mirror 109 has a capture angle of ±60°, an incident angle of the channel part 150 becomes ±15°. Equation 11 gives the condition that prevents the EUV light 108 from shielded by the channel part 150:

$$2a/L \geq \tan 15° \quad (11)$$

From Equations 10 and 11, a permissible range of the length L of the channel part 150 may be defined by the radius "a" of the channel part 150 as in Equation 12:

$$10^6 \cdot a^3 \leq L \leq 2a/\tan 15°=7.46a \quad (12)$$

Figure 4:
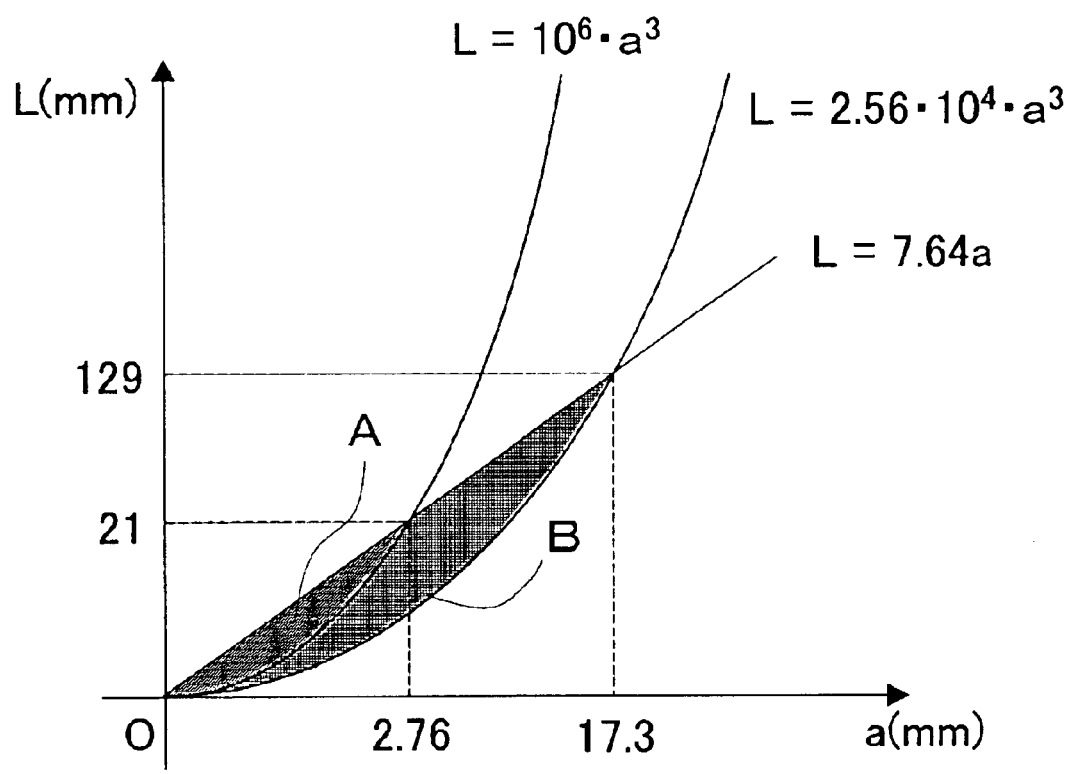
FIG. 4 is a graph showing a relationship between a radius and length of a channel part shown in FIG. 1.

FIG. 4 shows a range that suffices the inequality in Equation 12. The range in Equation 12 corresponds to an area A in FIG. 4 in which a=2.76 (mm) and L=21 (mm) where the radius "a" and the length L of the channel part 150 become maximum. This range makes the alignment of the optical axis difficult, and does not provide much tolerance to the beam size b12 of 0.8 (mm).

Figure 5:
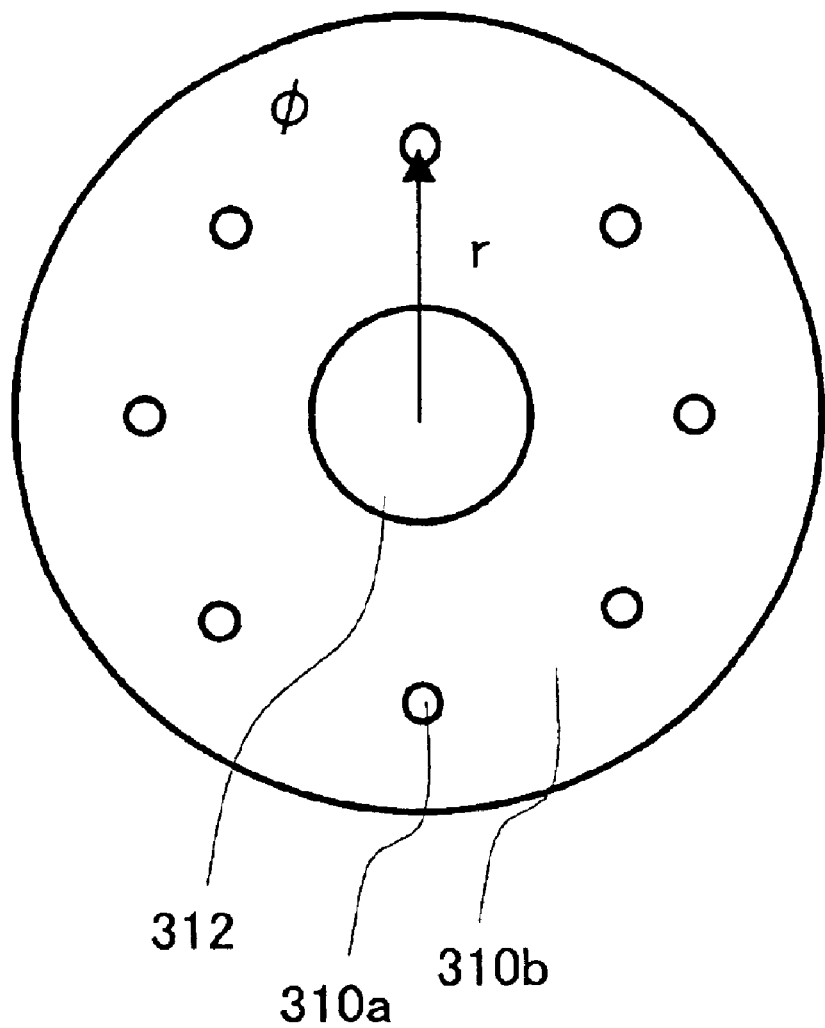
FIG. 5 is a view for explaining a design example of the disc shown in FIG. 1.

Accordingly, when the channel part 150 uses the disc 310, a time ratio between opening and closing is given by Equation 13 where a distance r from the center of the eight aperture parts 310*a* is 100 (mm) and an aperture part diameter Φ is 2 (mm) in FIG. 5:

$$\text{OPEN/CLOSE}=2:2\Pi r/8=1:39 \quad (13)$$

Therefore, the right side of Equation 10 may become 1/39, and Equation 12 becomes Equation 14:

$$2.56 \cdot 10^{4} \cdot a^3 \leq L \leq 2a/\tan 15°=7.46a \quad (14)$$

FIG. 4 shows a range that suffices the inequality in Equation 14. The range in Equation 14 corresponds to an area B in FIG. 4 in which "a"=17.3 (mm) and L=129 (mm) where the radius "a" and the length L of the channel part 150 become maximum. Apparently, this range does not make the alignment of the optical axis difficult and has enough tolerance to the beam size b12 of 0.8 (mm). This may further reduce the conductance of the channel part 150 for a pressure difference of $10^3$ Pa or greater, and lowers a reduced pumping speed to miniaturize the vacuum pumps 113 and 202. Here, FIG. 4 is a graph showing a relationship between the radius and length of the channel part 150, and FIG. 5 is an explanatory view of one design example of the disc 310.

Thus, use of the disk 310 for the channel part 150 would improve the differential pumping ability and increase the degree of freedom of design.

Of course, the instant embodiment is useful for applications using a point source X ray source, for example, a reflectometer, a wave front measurement device, a microscope, a shape measurement device, medical equipment, a chemical composition analyzer, and a structural analyzer.

In order to synchronize the emissions of the EUV light 108 with a rotation of the disc 310, or to connect the light source chamber 100 to the illumination system chamber 200 through the aperture parts 310*a* in the disc 310 when the EUV light emits, it is conceivable to make the disc 310 follow the emissions of the EUV light 108 as a master, or to make the emissions of the EUV light 108 follow the rotation of the disc 310 as a master. When the emission of the EUV light 108 is regarded as a master, the pulsed light emits at an emitting timing and thus information on the phase difference of the disc 310 cannot be obtained sufficiently. On the other hand, when the disc 310 becomes a master, the non-uniform rotations would offset the emitting timing of the EUV light 108 and deteriorate the exposure dose control.

Figure 6:
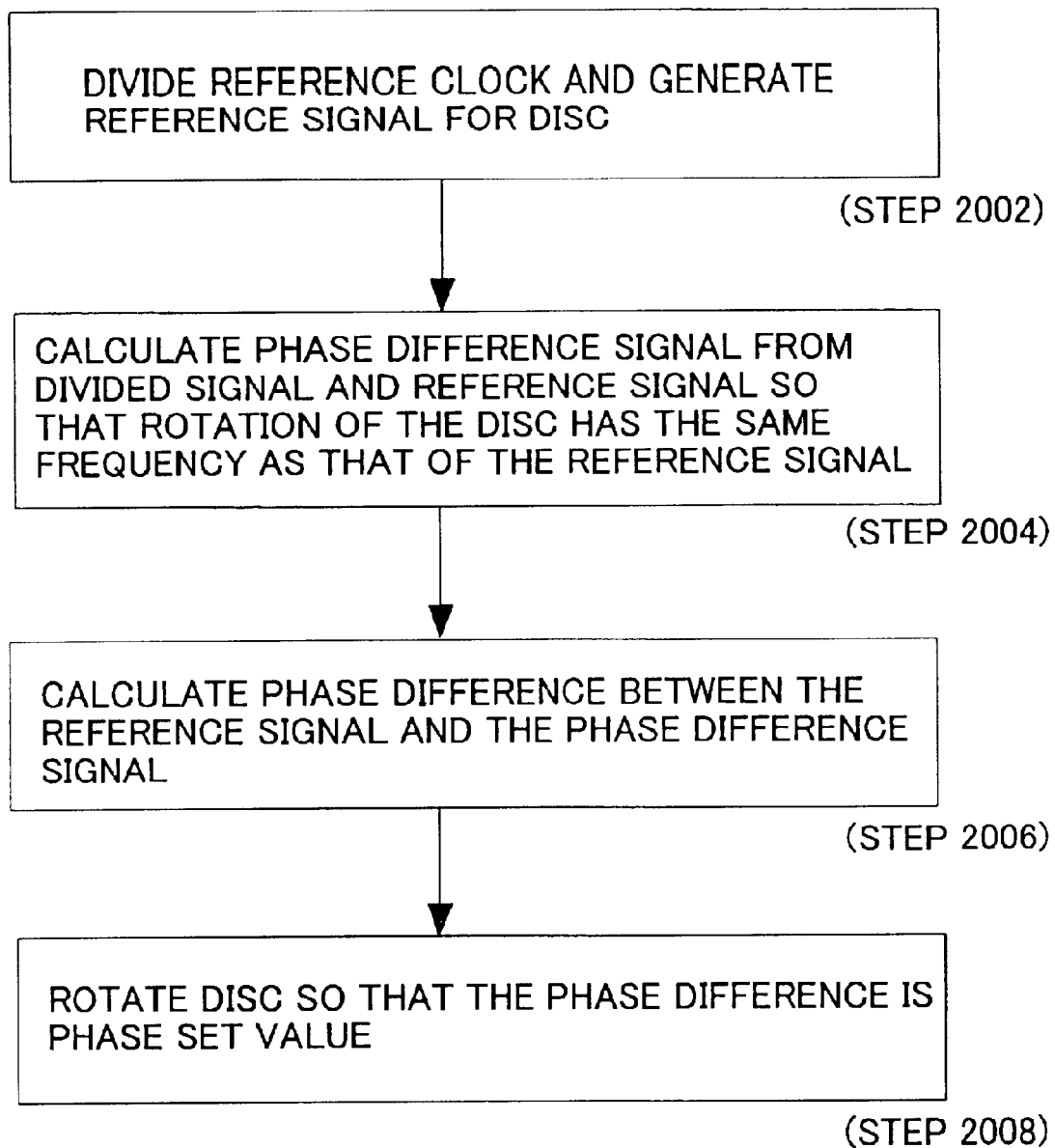
FIG. 6 is a flowchart for explaining a control method for controlling a rotation of a disc in a connection control mechanism.
Figure 7:
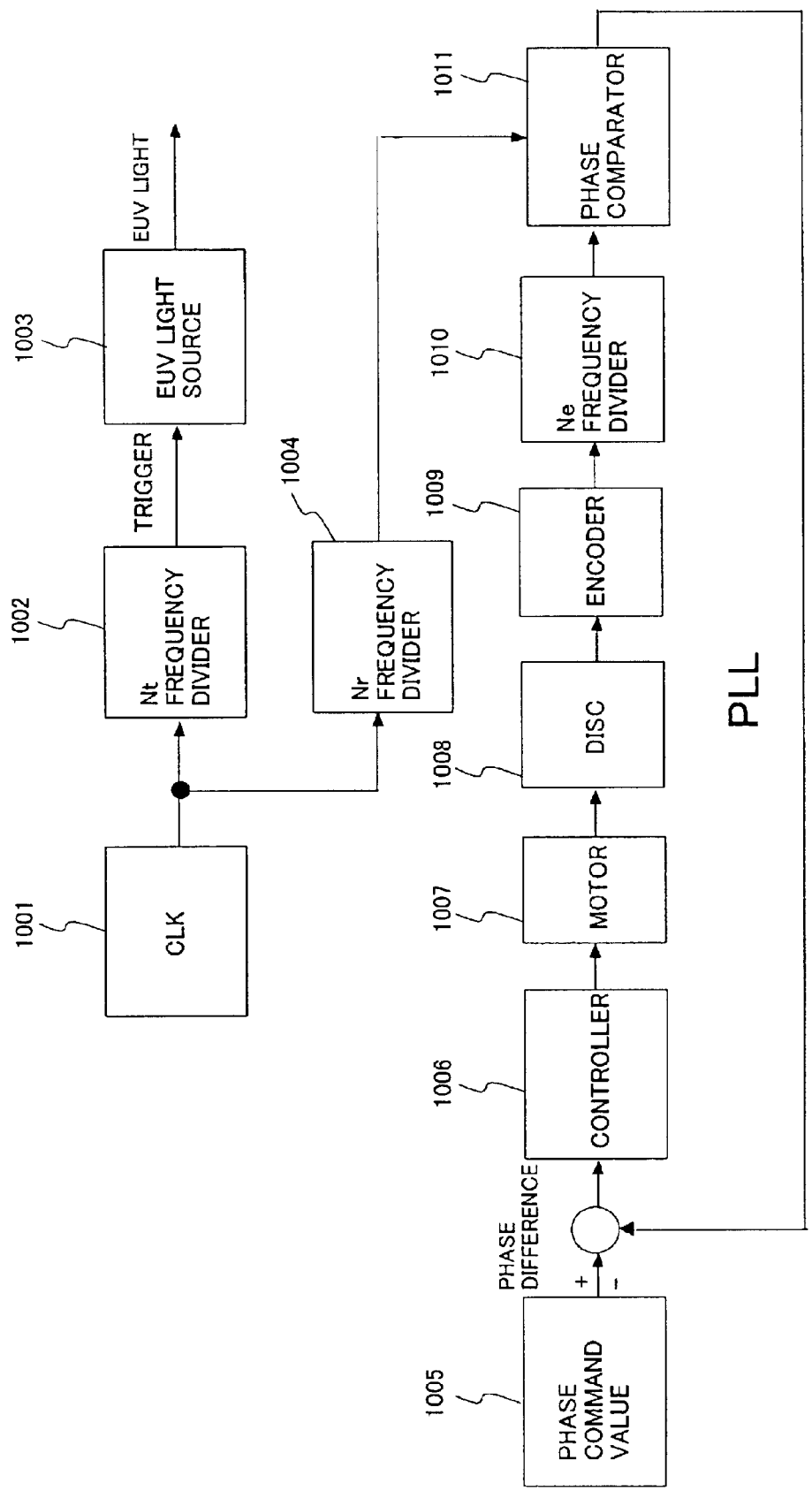
FIG. 7 is a control block diagram for highly precise synchronization between light emissions of the EUV light and a phase of a disc.

A description will be given of a control method 2000 that controls a rotation of the disc 310 in the connection control mechanism 300 with reference to FIGS. 6 to 11. FIG. 6 is a flowchart for explaining the control method 2000 for controlling a rotation of a disc 310 in a connection control mechanism 300. FIG. 7 is a control block diagram for highly precise synchronization between light emissions of the EUV light 108 and a phase of the disc 310. Such a control method that adjusts a phase is generally referred to as a phase locked loop ("PLL").

Figure 8:
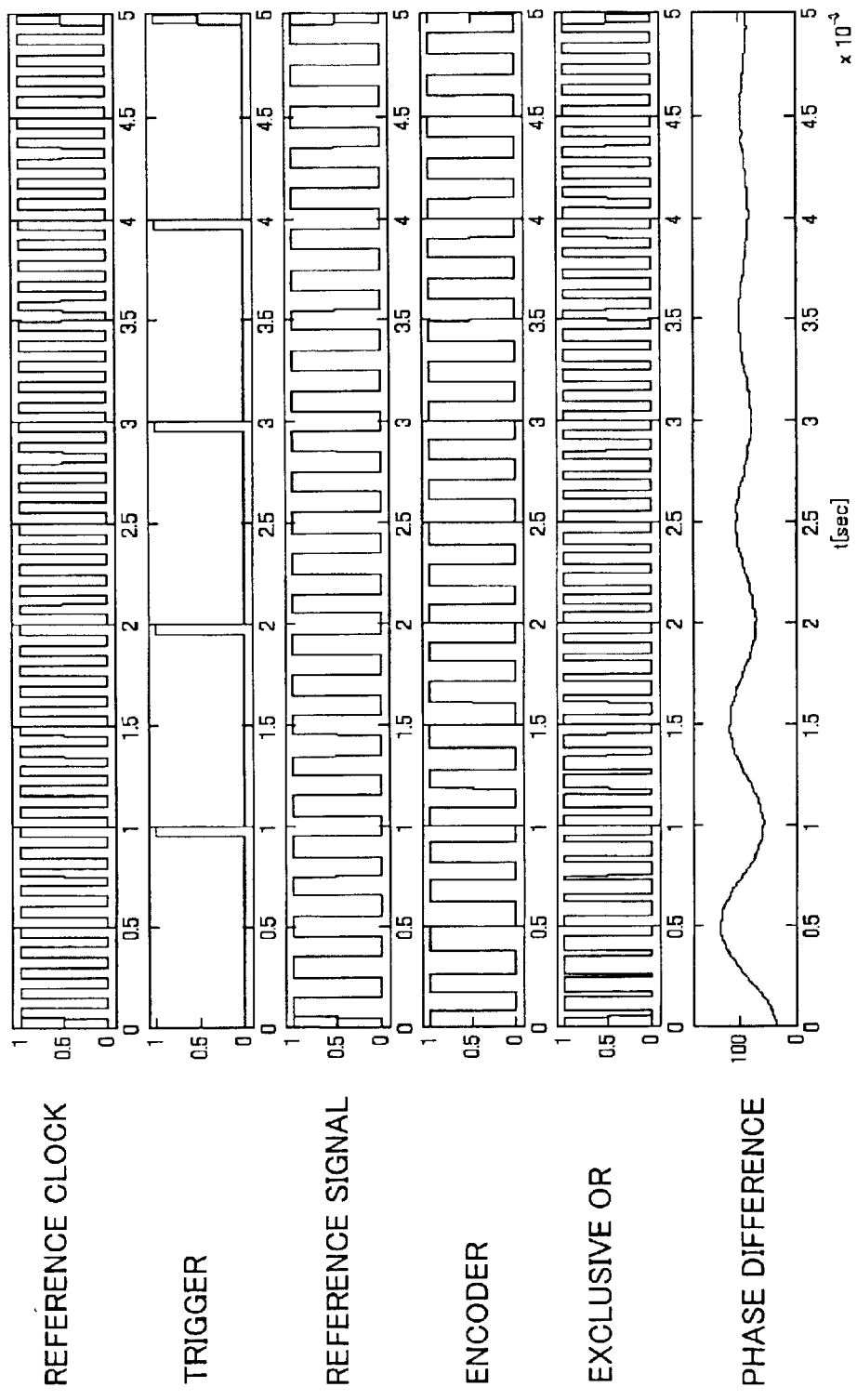
FIG. 8 is a waveform diagram of a phase detection using a digital circuit.

Referring to FIGS. 6 and 7, a signal derived from a reference clock 1001 is divided by an Nt divider 1002 so that it has an emission frequency of the EUV light 108 and provides a trigger signal to the EUV light source 1003. FIG. 8 shows a behavior of each signal, and how a trigger signal is obtained from a divided clock.

The reference clock is divided by the Nr divider 1004, and a reference signal of the disc 310 is generated (step 2002). A division ratio is determined within an operational range of the sensor 322 that detects set accuracy of a phase and an offset phase. As shown in FIG. 1, the sensor 322 monitors an aperture part 310*a* that offsets by half-turn from an aperture part 310 through which the EUV light 108 passes, and an operational range of the sensor 322 is determined by an aperture diameter of the opening 310*a*.

The disc 310's rotation 1008 is monitored by an encoder 1009, and divided by an Ne divider 1010 that is set so that it has the same frequency as the reference signal. Two divided signals are input to a phase comparator 1011 for exclusive OR operations, providing a waveform shown in a fifth stage in FIG. 8. The duty ratio of this pulse waveform is phase difference information: When this signal passes through a low-pass filter ("LPF"), then a phase difference signal is obtained as shown in a sixth stage in FIG. 8 (step 2004). The phase difference signal is fed back, as shown in FIG. 7, and a deviation from a phase command value 1005 is calculated as a phase difference (step 2006). This embodiment sets the phase difference command to 90°, and the controller 320 that also serves as a phase controller 1006 controls so that the phase difference is the phase set value. The hardware of the controller 320 includes an analog circuit or DSP, and the analogue circuit uses Proportional Integral and Differential ("PID") control for control operations, while the DSP uses a modern control, such as PID control, optimal regulator and H~ control for control operations. The motor 314's driving 1007 is controlled in accordance with the control amount from the controller 320, or so that a phase difference is the phase set value (Step 2008).

Figure 10:
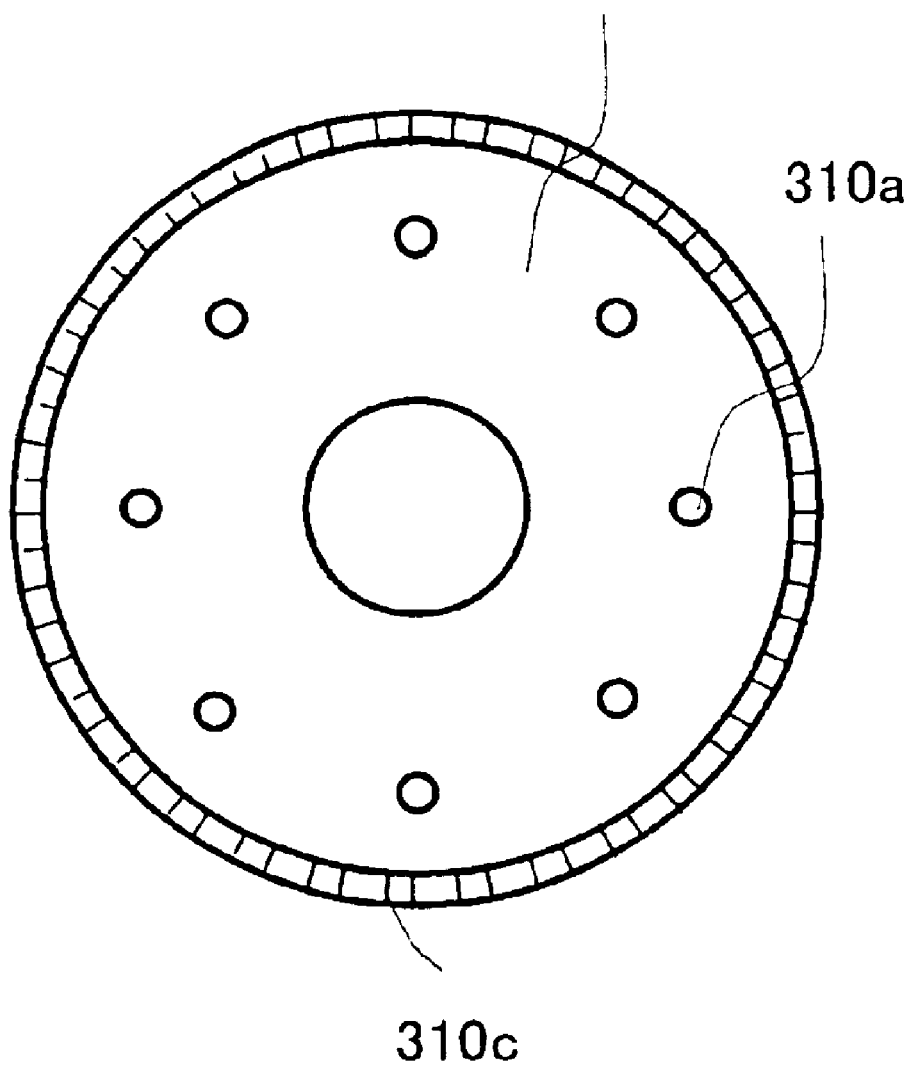
FIG. 10 is a schematic plane view showing one example of the disc shown in FIG. 1.

As shown in FIG. 10, a rotational amount of the encoder may be detected by providing an optical or magnetic pattern 310*c* around the disc 310. When the distortion of a motor shaft is negligible, the encoder directly attached to the motor 314 may be used. Here, FIG. 10 is a schematic plane view of an example of the disc 310.

Figure 11:
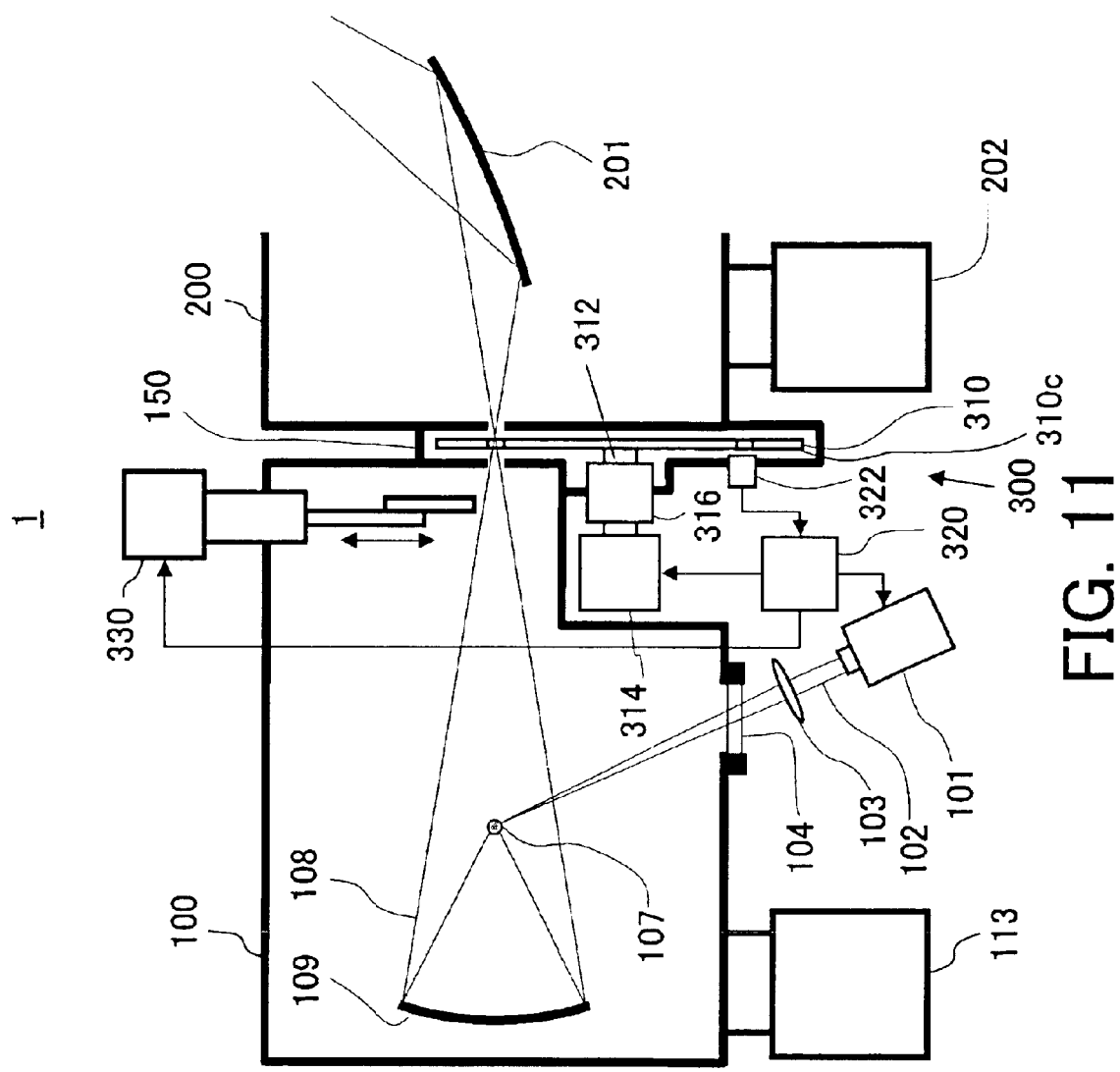
FIG. 11 is a schematic structure of a differential pumping system of one embodiment.

When a phase difference does not fall within a predetermined threshold range, the EUV light 108 is shielded from an opening part 310*a* of the disc 310, whereby the optical characteristic cannot be guaranteed, and the disc 310 gets damaged due to irradiation of the EUV light 108. Accordingly, the shutter 330 may be provided as shown in FIG. 11. FIG. 11 is a schematic structure of the differential pumping system 1 of one embodiment.

The shutter 330 is controlled by the controller 320, is closed when the disc 310 is activated, and becomes openable when the phase difference falls within the predetermined threshold. The controller 320 commands the shutter 330 to close in a range outside the predetermined threshold while the EUV light 108 is being used. In other words, the shutter 330 prevents the EUV light from entering the channel part 150 before an emission of the EUV light 108 corresponds to a connection between the light source chamber 100 and the illumination system chamber 200 or before the emission of the EUV light is synchronized with the aperture part 310*c* of the disc 310.

A description will be given of phase detection as a phase comparator. While an output of the encoder is a pulsed signal in FIG. 7, the sine wave as an original signal from the encoder may be used. As shown in a fourth stage in FIG. 9, this signal is a signal that oscillates at ±1 V. Use of the original signal would omit a pulse generator in the encoder. The reference signal is given in pulse as discussed above.

Figure 9:
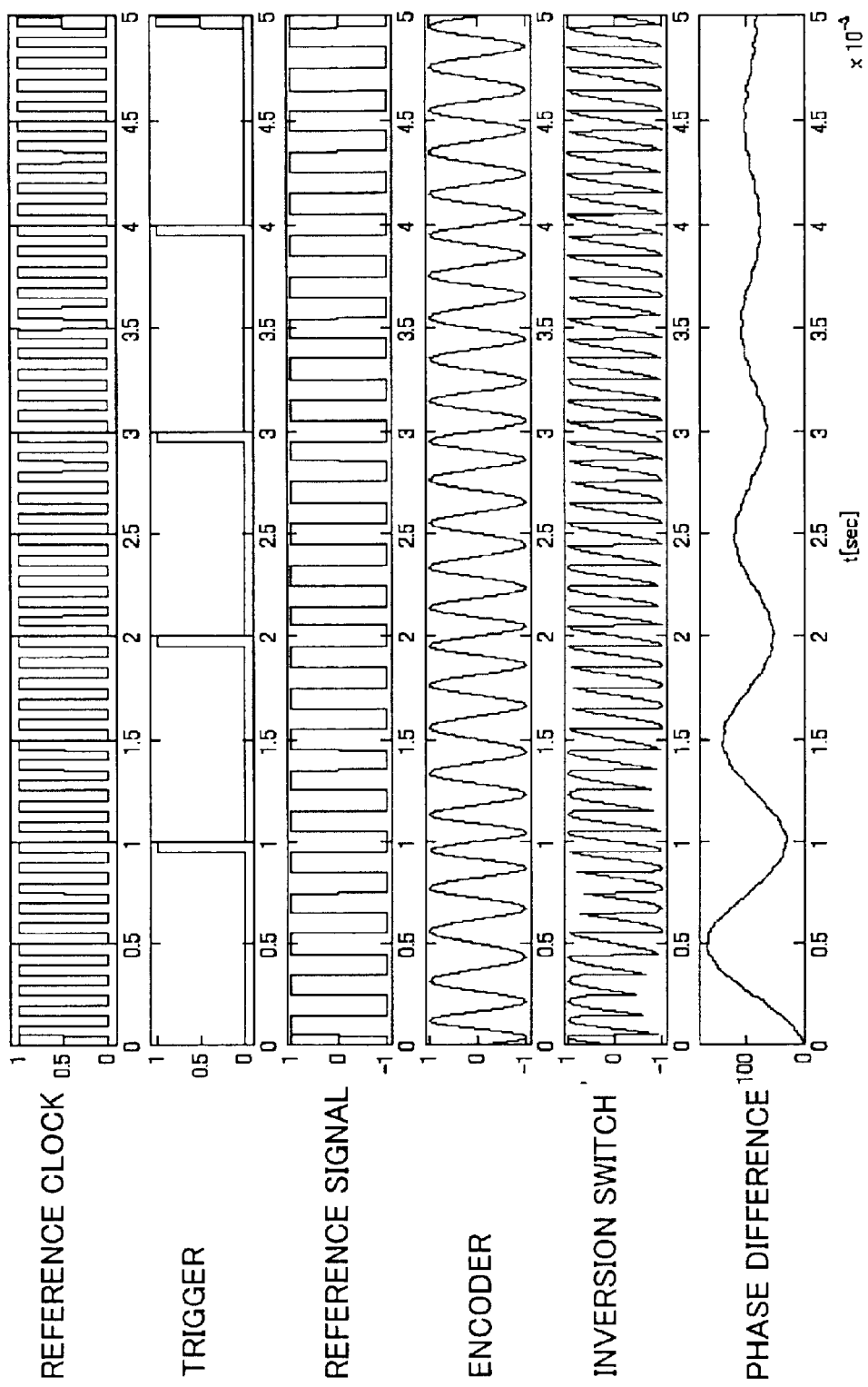
FIG. 9 is a waveform diagram of a phase detection using an analogue circuit.

The reference signal and the encoder are processed so that +1 times gain is applied to the encoder signal the reference signal is Hi (+1), while −1 times gain is applied to the encoder signal the reference signal is Low (−1). A specific circuit may be easily implemented by using an analogue switch to switch between a non-inverting amplifier and an inverting amplifier. The processed signal is shown at a fifth stage in FIG. 9. In this process, a phase of 0° would provide a wave front similar to a full wave rectification, and a rectification using a low-pass filter would provide $\frac{1}{2}^{1/2}$V. A phase offset by 180° would provide $-\frac{1}{2}^{1/2}$V, and a phase offset by 90° would provide 0 V. When the signal of the fifth stage in FIG. 9 is processed with a LPF and converted, phase information may be obtained like a waveform in a sixth stage.

A similar result may be obtained even when a reference signal is generated using a sine wave, and a mixer as an analogue multiplier or DSP.

A description will be given of another rotational control method of the disc 310 with reference to FIGS. 24 and 25. An exposure dose control method in an EUV exposure apparatus needs to control the number of pulses so as to maintain the predetermined exposure dose within a certain period, and requires variable light source emission frequency since the EUV pulse light source has light amount deviation for each pulsed light. In order to improve the precision of the exposure dose control, the emission repetition rate must be 3 kHz or greater. In order to efficiently obtain the EUV light using the differential pumping system that includes the above laser plasma light source and rotator, the exposure dose control factor in the exposure apparatus may be synchronized with the emissions of the EUV light 108 and a rotation of the disc 310. When the emissions of the EUV light 108 become a master, the pulsed light emits at an emitting timing and thus information on the phase difference of the disc 310 cannot be obtained sufficiently. On the other hand, when the disc 310 becomes a master, the non-uniform rotations would offset the emitting timing of the EUV light 108 and deteriorate the exposure dose control. The instant embodiment discusses a control method that solves the above problems.

Figure 24:
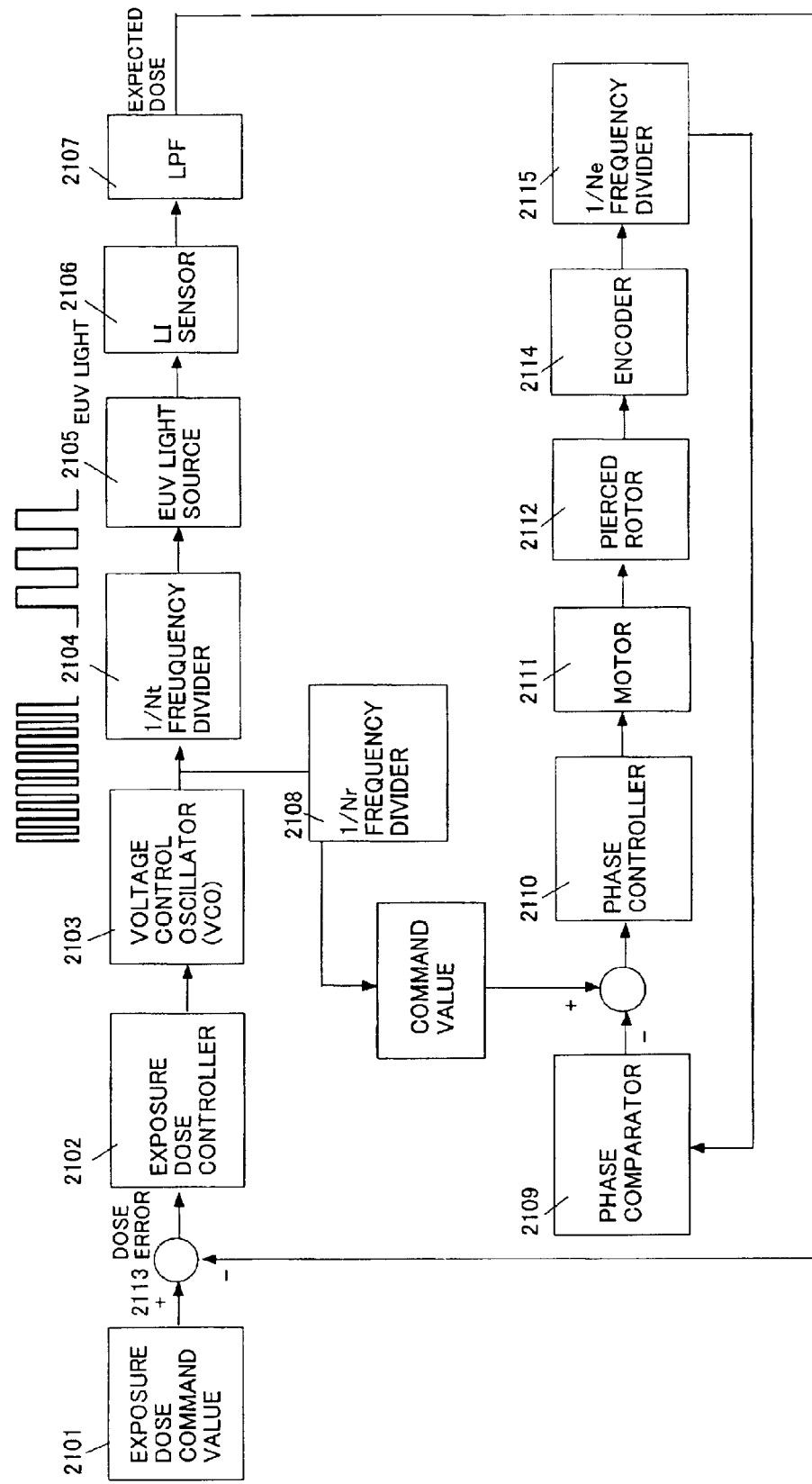
FIG. 24 is a block diagram for executing a control method different from that of FIG. 7.

FIG. 24 is a control block diagram for highly precise synchronization between light emissions of the EUV light 108 and a phase of the disc 310. An upper stage in the control block in FIG. 24 indicates an EUV light-source emission control loop, and a lower stage indicates a rotator control loop.

When a command value is input to the exposure dose control 2102 from an exposure dose control value 2101 in the upper-stage control loop, the exposure dose control 2102 outputs a value corresponding to the command value. When the value is input into the voltage control oscillator ("VCO") 2103, a reference clock (or frequency data in a first stage in FIG. 25) is output in synchronization with the exposure dose command value. The emission clock (in a second stage in FIG. 25) for emissions of the light source is generated from the Nt divider 2104 using the frequency data. The EUV light source 2105 emits at timing in synchronization with this emission clock, and is fed back, via a light integrate ("LI") sensor 2106 that always detects the exposure dose (light energy amount or a corresponding value) in the illumination system and a LPF 2107, to an control operation 2113, which provides a PID control for desired exposure dose and highly precise light amount adjustment. A method to control oscillation timing of the pulsed light source is as described above in accordance with the exposure dose value.

Figure 25:
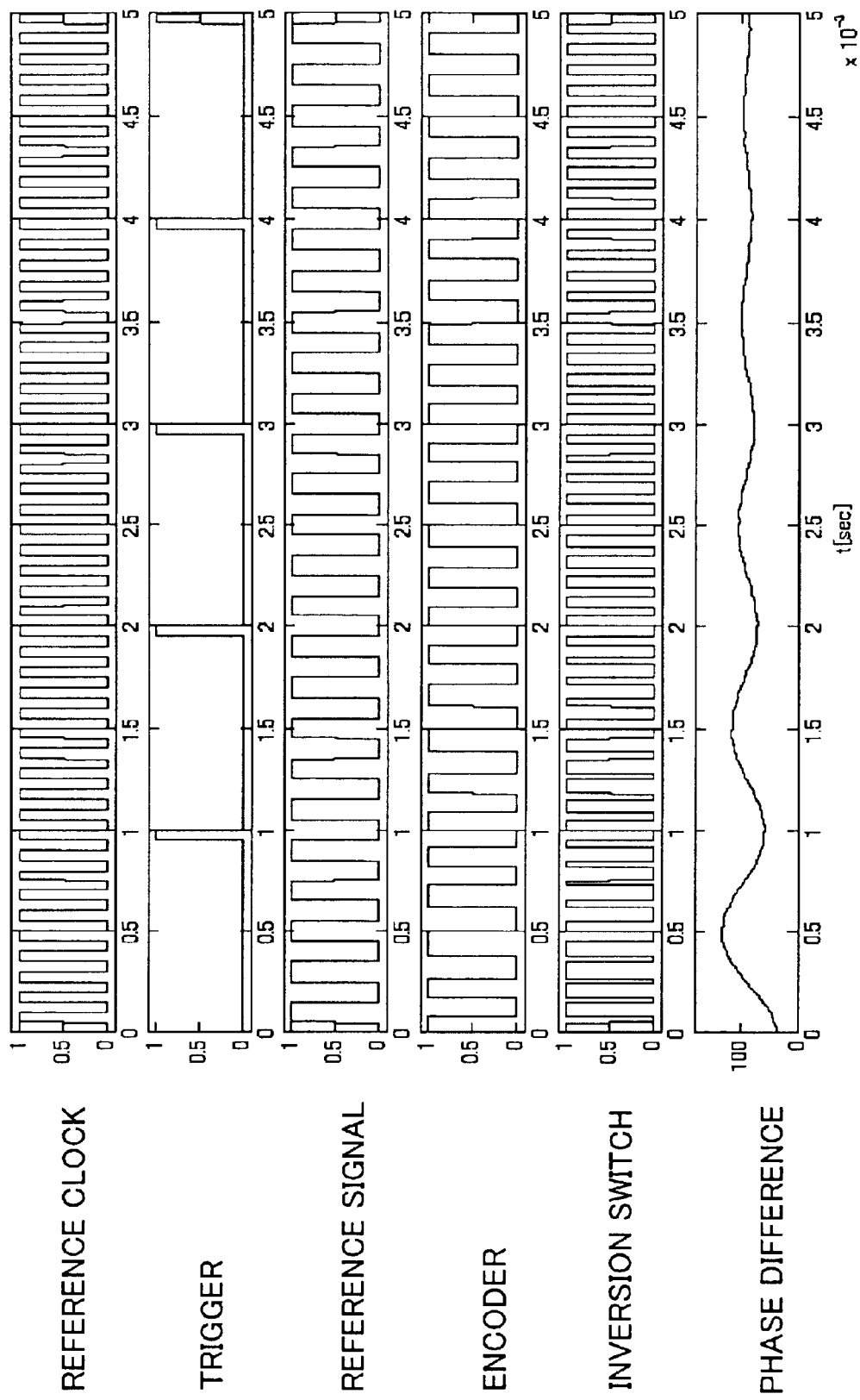
FIG. 25 is a waveform diagram of a control method shown in FIG. 7.

The low-stage control loop uses an Nr divider 2108 to divide the reference clock (in the first stage in FIG. 25) output from the VCO 2103 for use with reference of the disc 310 (in the third stage in FIG. 25). A division ratio is determined within an operational range of the sensor 322 that detects set accuracy of a phase and an offset phase. Since the sensor 322 monitors a hole that offsets by half-turn from the hole through which the EUV light 108 in FIG. 11, the operational range of the sensor 322 is determined by a hole diameter.

The rotator 2112's rotation is monitored by an encoder 2114 in FIG. 24, and divided into an encoder signal (in a fourth stage in FIG. 25) by an Ne divider 2115 that is set so that it has the same frequency as the reference signal in a third stage in FIG. 25. A phase comparator 2109 performs an exclusive OR operation, and provides a waveform shown in a fifth stage in FIG. 25. A duty ratio of this pulse waveform is phase difference information: When this signal passes through an LPF, then a phase difference signal is obtained as shown in a sixth stage in FIG. 25. This phase difference signal is fed back, and a deviation from a phase command value 1005 is calculated as a phase error for such control that this phase error may be a predetermined value. The hardware of the phase controller 2110 includes an analog circuit or DSP, and the analogue circuit uses PDI control for control operations, while the DSP performs uses a modern control, such as PID control, optimal regulator and H∞ control for control operations. A motor 2111 is driven in accordance with the control amount from a phase controller 2110. The motor 2111 may use a DC motor, an AC motor, a stepper motor, an ultrasonic motor, etc. The motor 2111 is mounted with a pierced rotator 2112 as an object to be controlled. An optical or magnetic pattern is provided around the disc 310 like 310c in FIG. 11, and a rotational amount of the encoder is monitored. When the distortion of the motor shaft is negligible, the encoder directly attached to the motor may be used.

When a phase difference does not fall within a predetermined threshold range, the EUV light 108 is shielded from an opening part of the disc 310, whereby the optical characteristic cannot be guaranteed, and the disc 310 gets damaged due to irradiation of the EUV light 108. Accordingly, the shutter 330 may be provided. The shutter 330 is closed when the disc 310 is activated, and becomes openable when the phase difference falls within the predetermined threshold. The controller 320 commands the shutter 330 to close in a range outside the predetermined threshold while the EUV light 108 is being used.

The instant embodiment provides the channel part that connects the light source chamber to the illumination system chamber, with a rotator that is sealed with a small aperture and has a pierce with a size enough to condense light. The instant embodiment thus provides an exposure apparatus that has a high differential pumping function without lowering the use efficiency of the EUV light even in case of variable frequency control by generating a reference signal from this differential pumping system for creating a desired pressure difference and a signal for controlling the exposure dose commanded by the exposure apparatus side, generating a synchronous signal used for emissions of the EUV light as a pulsed light source based on this reference signal, controlling the rotator with this reference signal so that it opens during emissions and closes other than that period.

Figure 12:
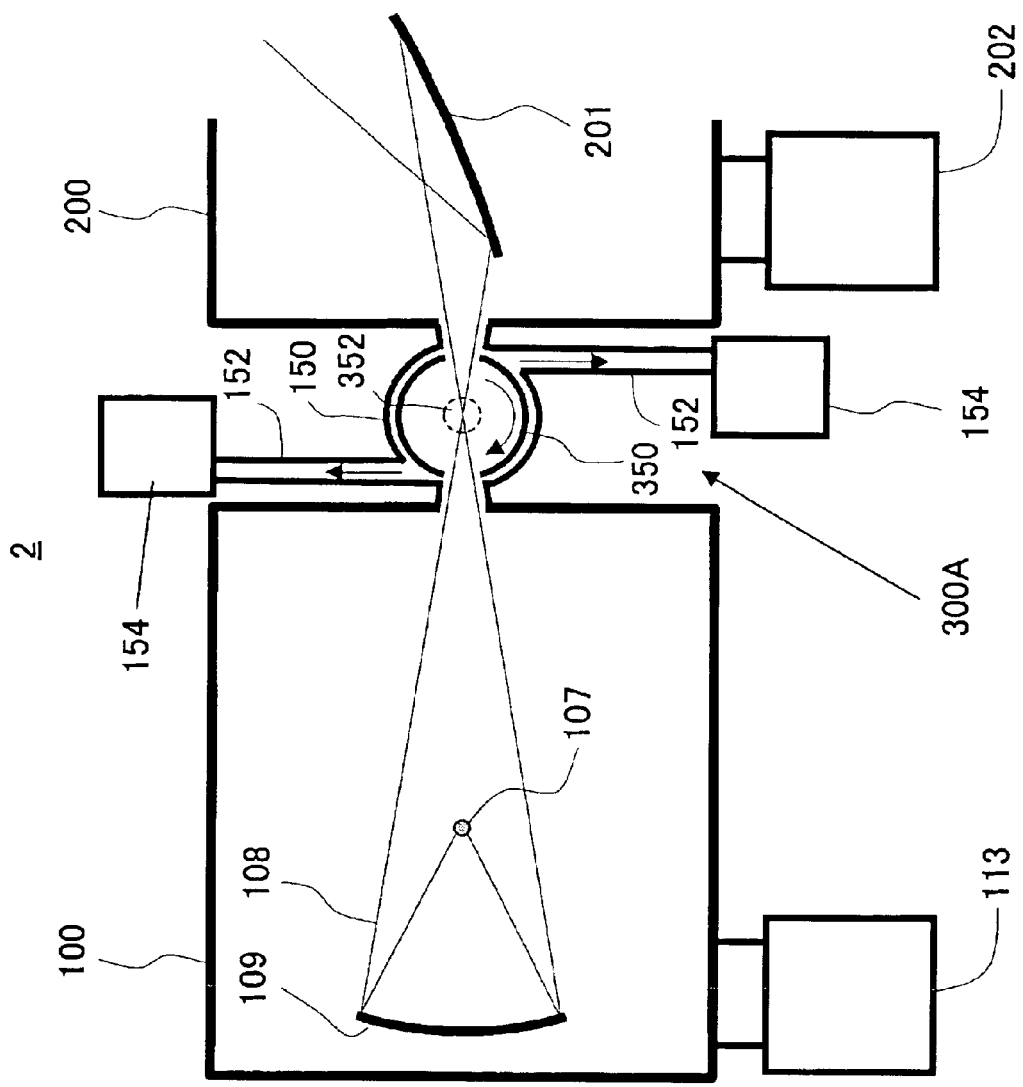
FIG. 12 is a schematic structure of a differential pumping system of one embodiment according to the present invention.

A description will be given of a differential pumping system 2 as a variation of the differential pumping system 1, with reference to FIGS. 12 to 14. FIG. 12 is a schematic structure of the differential pumping system 2 of one embodiment. The differential pumping system 2 is similar to the differential pumping system 1, but different in having a connection control mechanism 300A. More specifically, the differential pumping system 2 is provided with a drum 350 as a cylindrical member in the channel part 150 instead of a disc 310.

Figure 13:
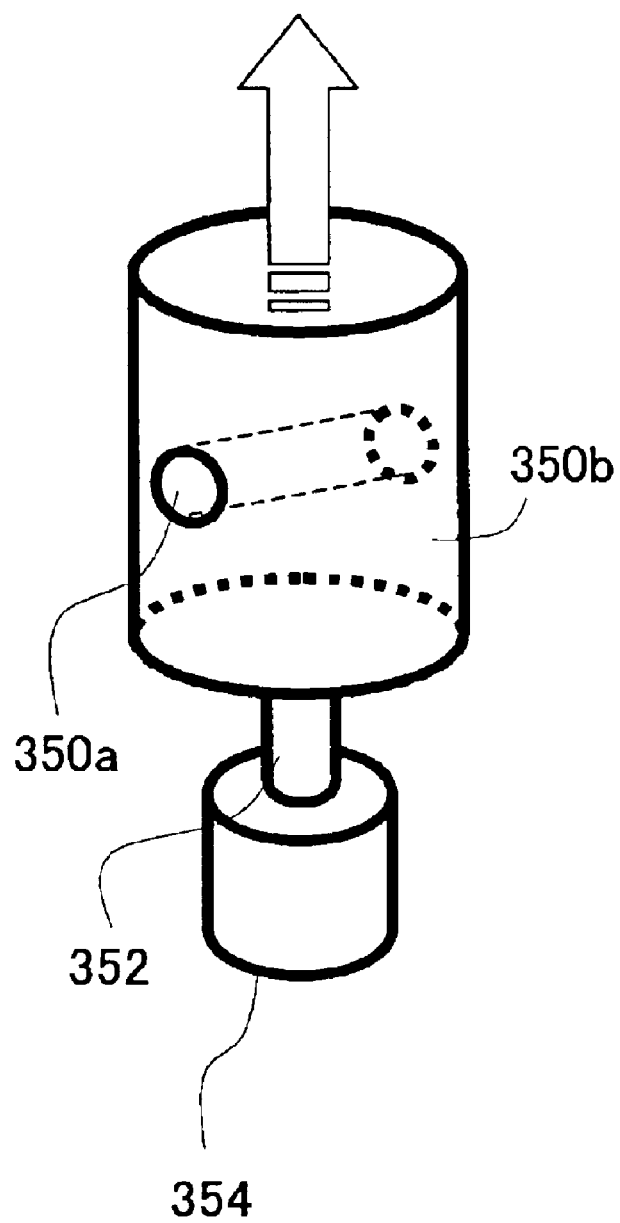
FIG. 13 is a schematic perspective view showing one exemplary drum shown in FIG. 12.

The drum 350 includes as shown in FIG. 13, an aperture part 350a through which the EUV light 108 passes, and a shield part 350b that disconnects the light source chamber 100 from the illumination system chamber 200. The drum 350 is rotatably driven around a shaft 352. Similar to the disc 310, the controller 320 synchronizes the drum 350 with the emission frequency of the laser generator 101 and rotates it so that the light source chamber 100 may be connected to the illumination system chamber 200 when the EUV light emits 108. Here, FIG. 13 is a schematic perspective view of one example of the drum 350 shown in FIG. 12.

When the light source chamber 100 is disconnected from the illumination system chamber 200, gas molecules that hit the shield part 350b of the drum 350 are blown away. Therefore, the channel part 150 provides an exhaust port 152 in a direction in which the gas molecules are blown away by the shield part 350b of the drum 350 and exhausts them using the exhaust means 154 for efficient exhaustion. The more efficient exhaustion may be available by exhausting gas molecules that have reached inside the drum 350.

Since the condenser mirror 109 has a large capture angle, the aperture part 350a has a large aperture diameter. Accordingly, a diameter of the drum 350 is made small to reduce its aperture diameter and increase the number of rotations. Therefore, a diameter of the drum 350 is determined by taking the emitting frequency of the EUV light 108 and the capture angle of the condenser mirror 109 into consideration.

Figure 14:
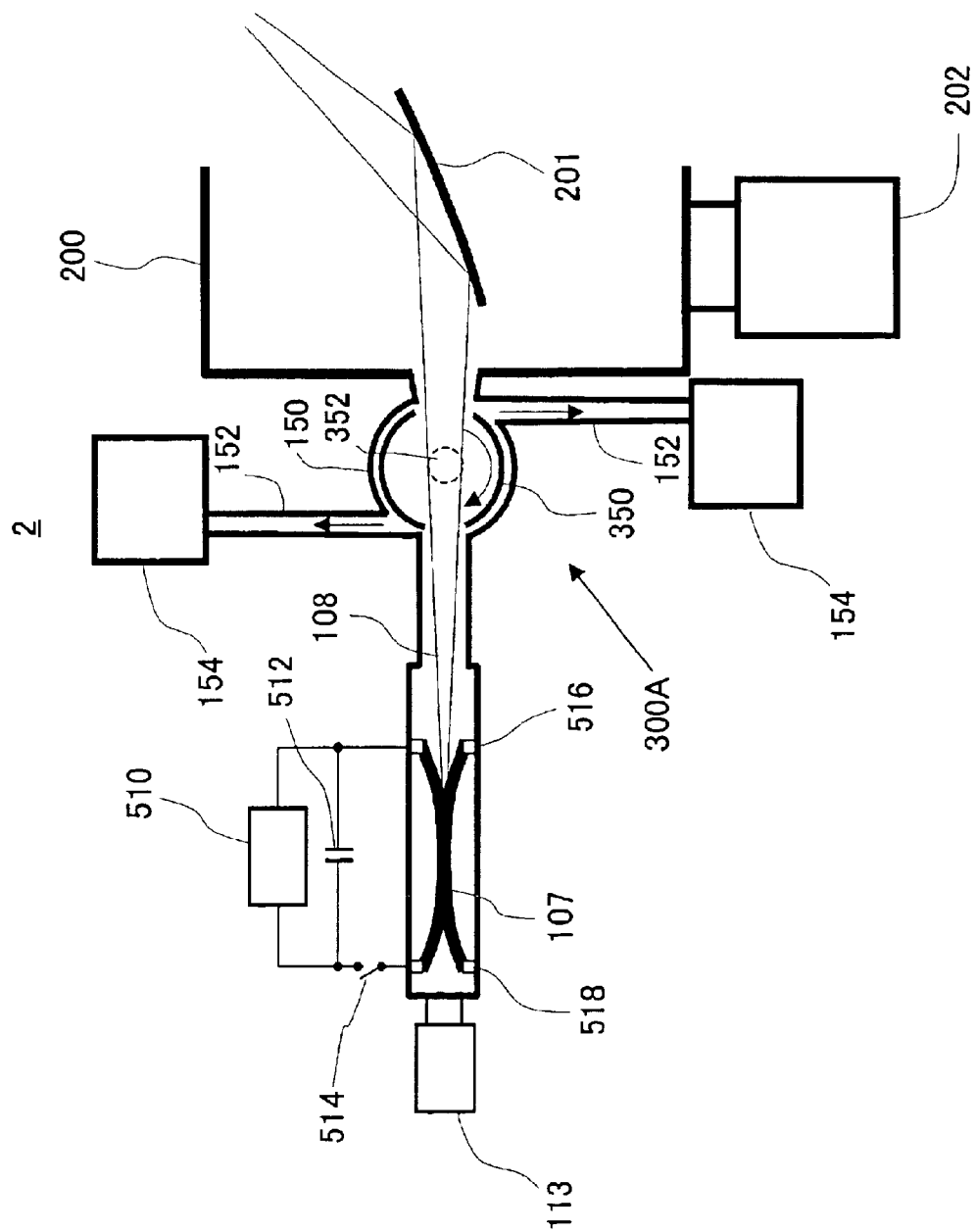
FIG. 14 is a schematic structure of a differential pumping system that utilizes a Z pinch method as one mode of discharge methods for an EUV light source.

FIG. 14 is a schematic structure of the differential pumping system 2 that uses a Z-pinch as a discharge method that is one EUV light source mode. Referring to FIG. 14, a capacitor 512 stores the energy for a high voltage source 510, uses a switch 514 to generate plasma 107 between an anode 516 and a cathode 518, collects the high density plasma near the center and emits the EUV light 108. Inert gas, such as Xe gas may be used as a gas for a plasma source.

The discharge method does not emit the EUV light like a laser plasma method, and has directivity to some extent. Therefore, the optical element 201 may be located apart from the light source chamber 100, and the channel part 150 that has the drum 350 may be arranged between the light source chamber 100 and the optical element 201 for sufficient differential pumping ability. In addition, it is not necessary to replace the optical element 201.

While the discharge method includes other modes of plasma focus, capillary discharge, hollow cathode triggered Z-pinch, etc., these modes may be applicable to the inventive differential pumping system.

Figure 26:
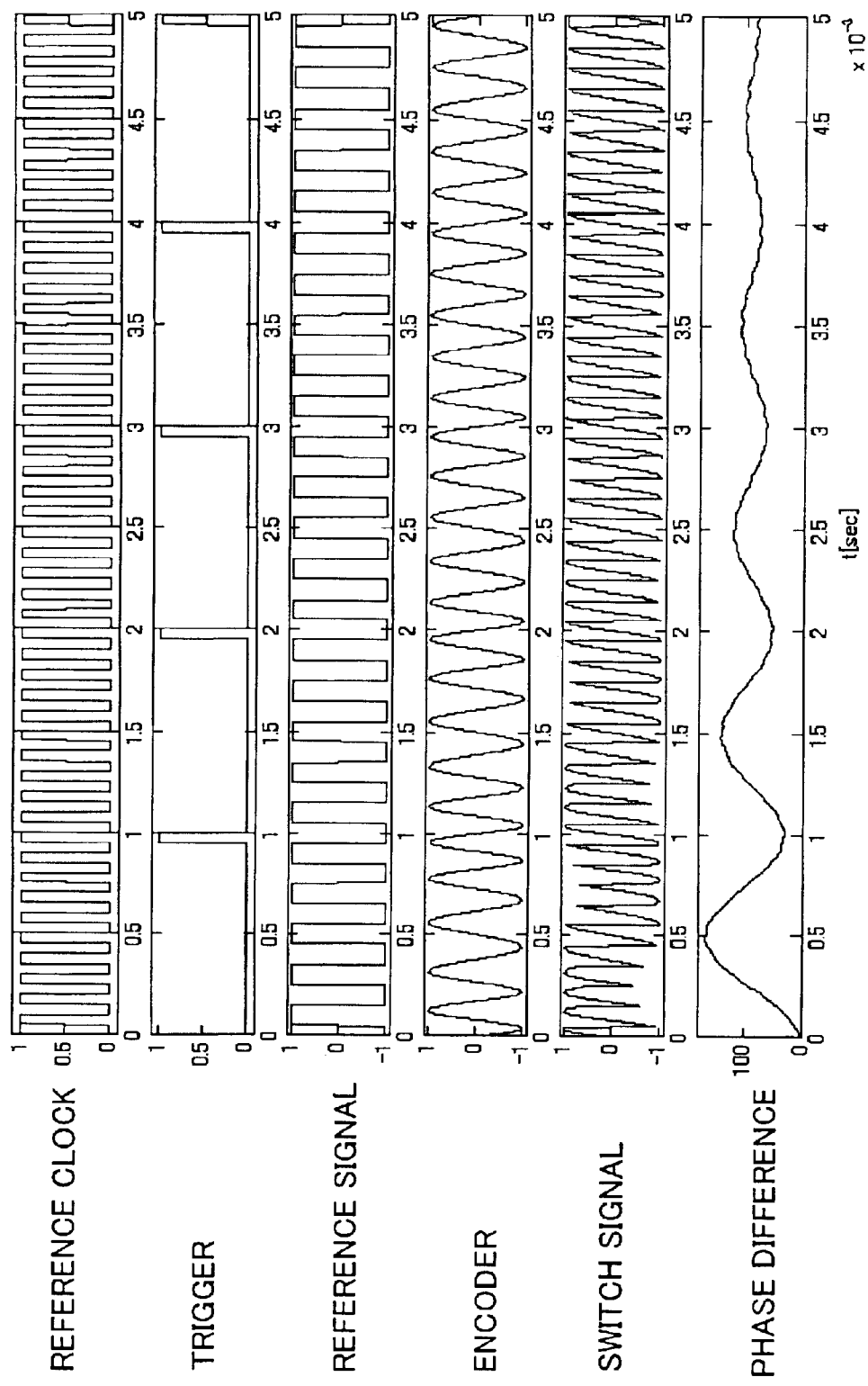
FIG. 26 is a waveform diagram when the control method shown in FIG. 7 is applied to a structure shown in FIG. 12.

A description will be given of phase detection as the phase comparator shown in FIGS. 24 and 25. While an output of the encoder 2114 is a pulsed signal in FIG. 24, a sine wave (or analog output) as an original signal from the encoder is used in this embodiment. As shown in a fourth stage in FIG. 26, this signal is a signal that oscillates at ±1 V. Use of the original signal would omit a pulse generator in the encoder. The reference signal is given in pulse as discussed above.

The reference signal and the encoder are processed so that +1 times gain is applied to the encoder signal the reference signal is Hi (+1), while −1 times gain is applied to the encoder signal the reference signal is Low (−1). A specific circuit may be easily implemented by using an analogue switch to switch between a non-inverting amplifier and an inverting amplifier. The processed signal is shown at a fifth stage in FIG. 26. In this process, a phase of 0° would provide a wave front similar to a full wave rectification, and a rectification using a low-pass filter would provide $½^{1/2}$V. A phase offset by 180° would provide $-½^{1/2}$V, and a phase offset by 90° would provide 0 V. When the signal of the fifth stage in FIG. 3 is processed with a low-pass filter and converted, phase information may be obtained like a waveform in a sixth stage.

A similar result may be obtained even when a reference signal is generated using a sine wave, and a mixer as an analogue multiplier or DSP.

The instant embodiment thus provides an exposure apparatus that has a high differential pumping function without lowering the use efficiency of the EUV light even in case of variable frequency control by generating a reference signal from this differential pumping system and a signal for controlling the exposure dose commanded by the exposure apparatus side, generating a synchronous signal used for emissions of the EUV light as a pulsed light source based on this reference signal, controlling the rotator with this reference signal so that it opens during emissions and closes other than that period.

Figure 15:
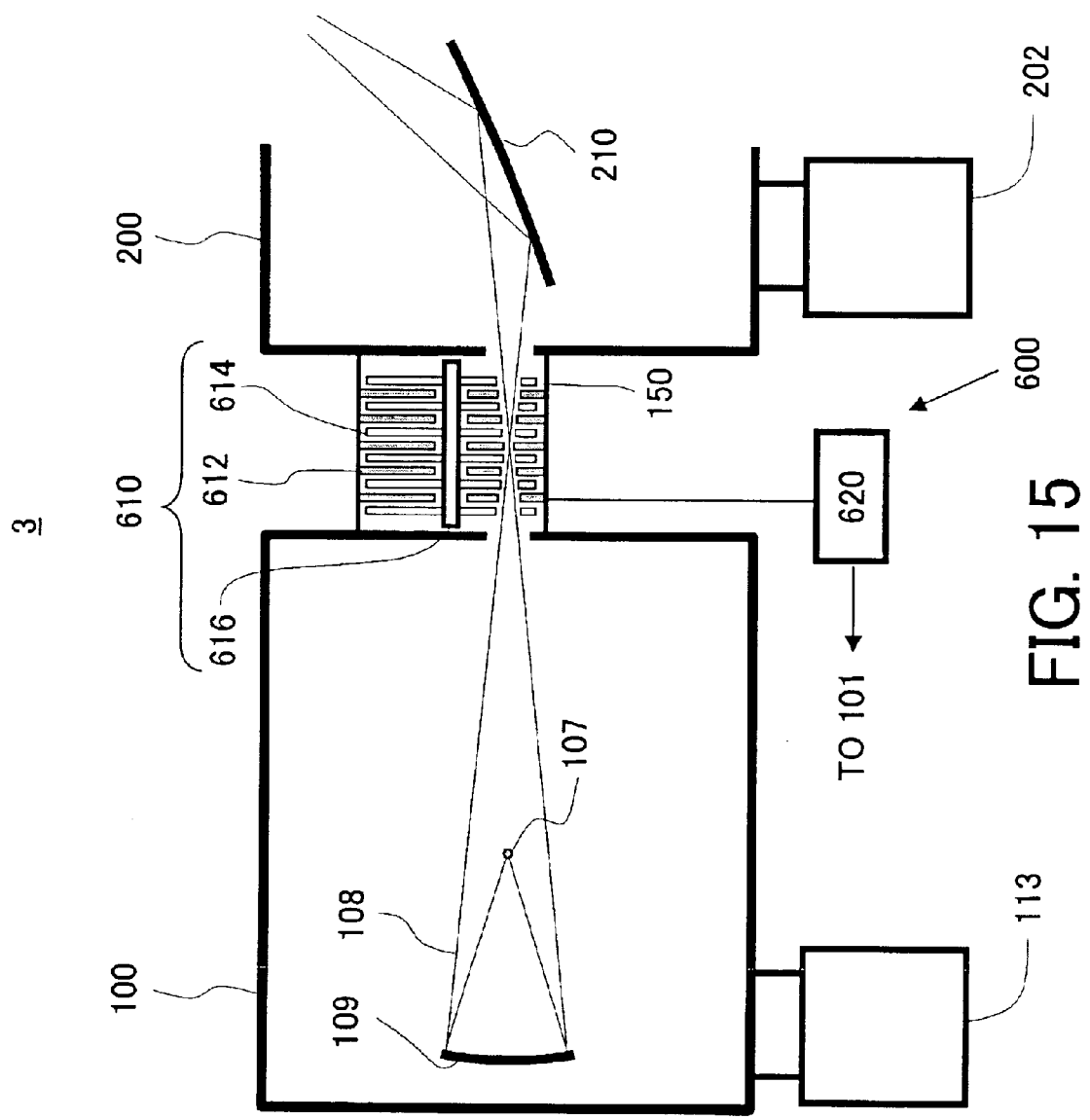
FIG. 15 is a schematic structure of a differential pumping system of one embodiment according to the present invention.

A description will now be given of another differential pumping system 3 according to the present invention, with reference to FIGS. 15 to 19. FIG. 15 is a schematic structure of the differential pumping system 3 of another embodiment according to the present invention. The differential pumping system 3 is similar to the differential pumping system 1, but different in having a connection control mechanism 600.

The connection control mechanism 600 includes a pump 610 that exhausts an atmosphere in the illumination system chamber 200 to the light source chamber 100 via the channel part 150, and a controller 620. The pump 610 includes a stator 612 and a rotor 614.

Figure 16:
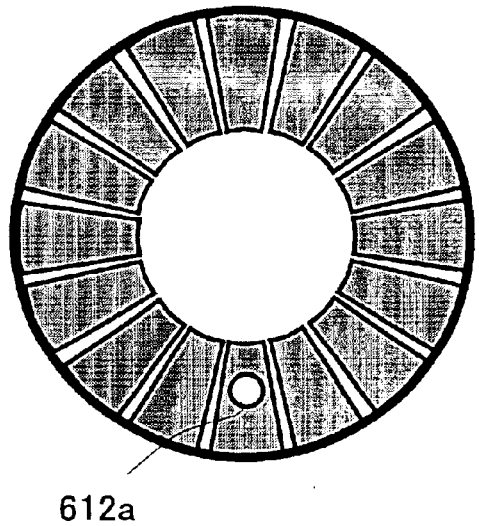
FIG. 16 is a schematic plane view showing one exemplary stator shown in FIG. 15.

The stator 612 includes, as shown in FIG. 16, one first opening 612a through which the EUV light 108 passes. The stator 612 is fixed onto a magnetic bearing 616 so that an optical path of the EUV light 108 is aligned with the first aperture part 612a. Here, FIG. 16 is a schematic plane view showing one example of the stator 612 shown in FIG. 15.

Figure 17:
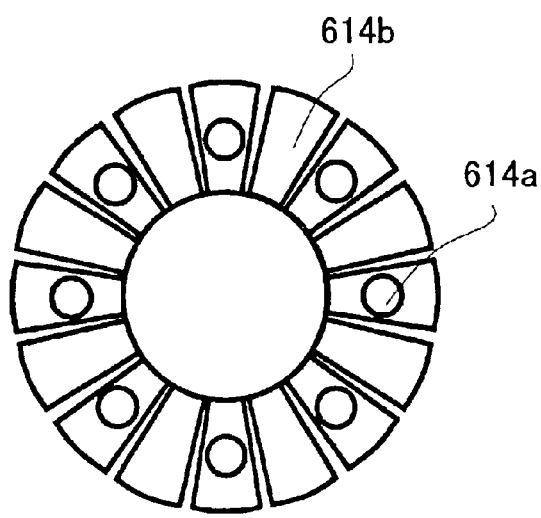
FIG. 17 is a schematic plane view showing one exemplary rotator shown in FIG. 15.

The rotor 614 includes, as shown in FIG. 17, plural second aperture parts 614a through which the EUV light 108 passes, and a shield part 614b that disconnects the light source chamber 100 from the illumination system chamber 200. The number of second aperture parts 614a is determined by the emitting period of the EUV light 108 and the number of rotations of the pump 610. The rotor 614 is connected to the magnetic bearing 614 so that the rotor 614 is rotatable around the magnetic bearing 614. Here, FIG. 17 is a schematic plane view of one example of the rotor 614 shown in FIG. 15.

The controller 620 controls the rotor 614 so that the light source chamber 100 is connected to the illumination system chamber 200 when the plasma 107 emits and the light source chamber 100 is disconnected from the illumination system chamber 200 other than during a period when the plasma 107 emits. In other words, the controller 620 controls rotations of the rotor 614 so that the EUV light 108 may pass the second aperture part 614a in synchronization with emissions of the EUV light 108.

Since wings of the stator 612 and the rotor 614, which are provided with the first aperture part 612a and the second aperture parts 614a would lower the strength of the stator 612 and the rotor 614, they may have cutouts through which the EUV light 108 passes or remove a wing that would otherwise shield the EUV light 108.

The differential pumping system 3 makes the connection control mechanism 600 of the pump 610, and enables the pressure of the illumination system chamber 200 to be lower or provides a larger pressure difference, than the differential pumping systems 1 and 2.

Figure 18:
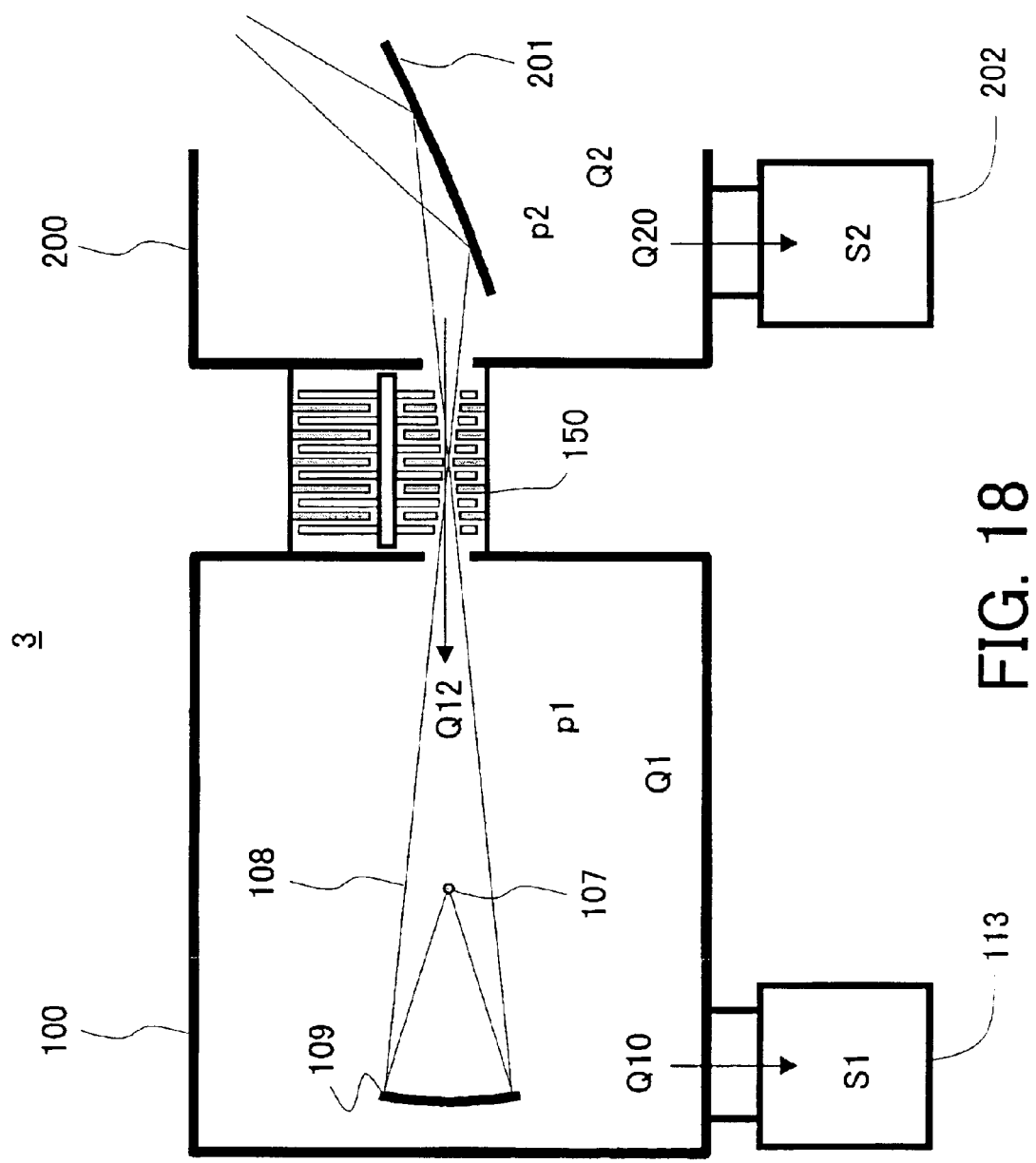
FIG. 18 is a view for explaining a design example of the differential pumping system shown in FIG. 15.

FIG. 18 is an explanatory view of a design example of the differential pumping system 3. Referring to FIG. 18, the following equations are met where p1 (Pa) is the pressure of the light source chamber 100, p2 (Pa) is the pressure of the illumination system chamber 200, S1 ($m^3$/s) is a pumping speed at which the vacuum pump 113 exhausts the light source chamber 100, S2 ($m^3$/S) is a pumping speed at which the vacuum pump 202 exhausts the illumination system chamber 200, S12 is a pumping speed of a connection control mechanism 600 provided in the channel part 150 that connects the light source chamber 100 to the illumination system chamber 200, Q1 (Pa·$m^3$/S) is degas amount generated from the light source chamber 100, Q2 (Pa·$m^3$/S) is degas amount generated from the illumination system chamber 200, Q10 (Pa·$m^3$/s) and Q20 (Pa·$m^3$/s) are flow rate exhausted by respective vacuum pumps 113 and 202, and Q12 (Pa·$m^3$/s) is the flow rate that flows through the channel part 150:

$$Q1+Q2=Q10+Q20 \qquad (15)$$

$$Q10=Q1+Q12 \qquad (16)$$

$$Q10=S1·p1 \qquad (17)$$

$$Q20=S2·p2 \qquad (18)$$

$$Q12=S12·p2 \qquad (19)$$

Equations 20 and 21 are obtained as follows from Equations 15 to 19 by deleting Q10, Q20 and Q12 and simplifying Q1>>Q2 for coordination of p1 and p2:

$$p1=(S2·Q1+S12·Q1+S12·Q2)/(S1·S2+S1·S12) \approx Q1/S1 \qquad (20)$$

$$p2=Q2/(S2+S12) \qquad (21)$$

When the pressure p1=10 (Pa), the pumping speed S1=S2=1 ($m^3$/s), the degas amounts Q1=10 (Pa·$m^3$/s) and Q2=$10^{-5}$ (Pa·$m^3$/s), p2=$10^{-5}$/(1+0.3)=7.7×$10^{-6}$ (Pa) and a pressure difference of p1/p2≧$10^6$ is available. However, indeed, when a pressure difference between the vacuum pumps 113 and 202 is about $10^5$, it becomes a basis and p1/p2≧about $10^5$.

Figure 19:
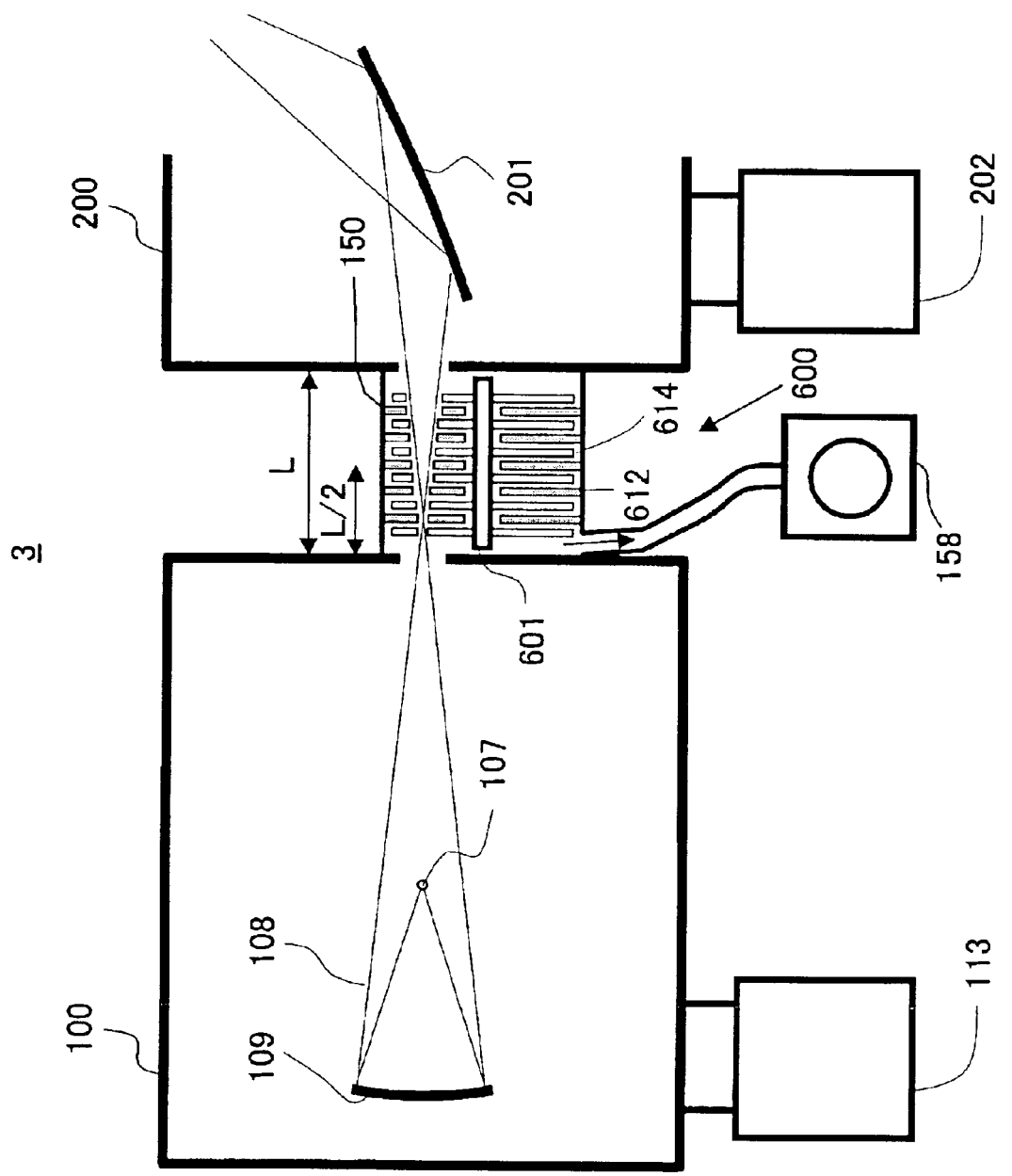
FIG. 19 is a schematic view showing a relationship between a focused point of the EUV light and the channel part in the differential pumping system shown in FIG. 15.

A description will be given of a relationship between the focused point 108a of the EUV light 108 and the channel part 150 with reference to FIG. 19. FIG. 19 is a schematic view showing a relationship between the focused point 108a of the EUV light 108 and the channel part 150.

Referring to FIG. 19, the first aperture part 612a or second aperture part 614a at the focused point 108a of the EUV light 108 may make the aperture diameter smallest, and an aperture diameter of each of the first aperture part 612a and the second aperture part 614a increases with distance from the focused point 108a. Therefore, an entire aperture diameter of the first aperture part 612a and the second aperture part 614a may be made small by providing the condensed point 108a at a position of L/2 where L is a length of the channel part 150.

The light source chamber 100 has an atmosphere of viscous flow, whereas the illumination system chamber 200 has an atmosphere of molecular flow. Therefore, a smaller aperture diameter at a side of the viscous flow or light source chamber 100 would maintain the low pressure of the illumination system chamber 200 or create a large pressure difference.

Thus, the focused point 108a of the EUV light 108 has an optimal value between 0 and L/2 for the length L of the channel part 150. Therefore, the pressure of the illumination system chamber 200 may be made low by providing the focused point 108a of the EUV light 108 at a side of the light source chamber 100.

Since the pump 610 exhausts from the illumination system chamber 200 side to the light source chamber 100 side, the pressure of the illumination system chamber 200 may be made lower or a larger pressure difference may be created, by providing a roughing vacuum pump 158 in the channel part 150 at the side of the light source chamber 100.

A description will be given of an exemplary inventive exposure apparatus 800 that uses the inventive differential pumping system 1 with reference to FIG. 20. Here, FIG. 20 is a schematic structure of the inventive exposure apparatus 800 of one embodiment.

The inventive exposure apparatus 800 is a projection exposure apparatus that uses EUV light with a wavelength of 13.4 nm as exposure light for step-and-scan or step-and-repeat exposure of a circuit pattern formed on the mask 820 onto an object 840 to be exposed. This exposure apparatus is suitable for a lithography process less than submicron or quarter micron, and the present embodiment uses the step-and-scan exposure apparatus (also referred to as a "scanner") as an example.

The "step-and-scan", as used herein, is an exposure method that exposes a mask pattern onto a wafer by continuously scanning the wafer relative to the mask, and by moving, after a shot of exposure, the wafer stepwise to the next exposure area to be shot. The "step-and-repeat" is another mode of exposure method that moves a wafer stepwise to an exposure area for the next shot every shot of cell projection onto the wafer.

Figure 20:
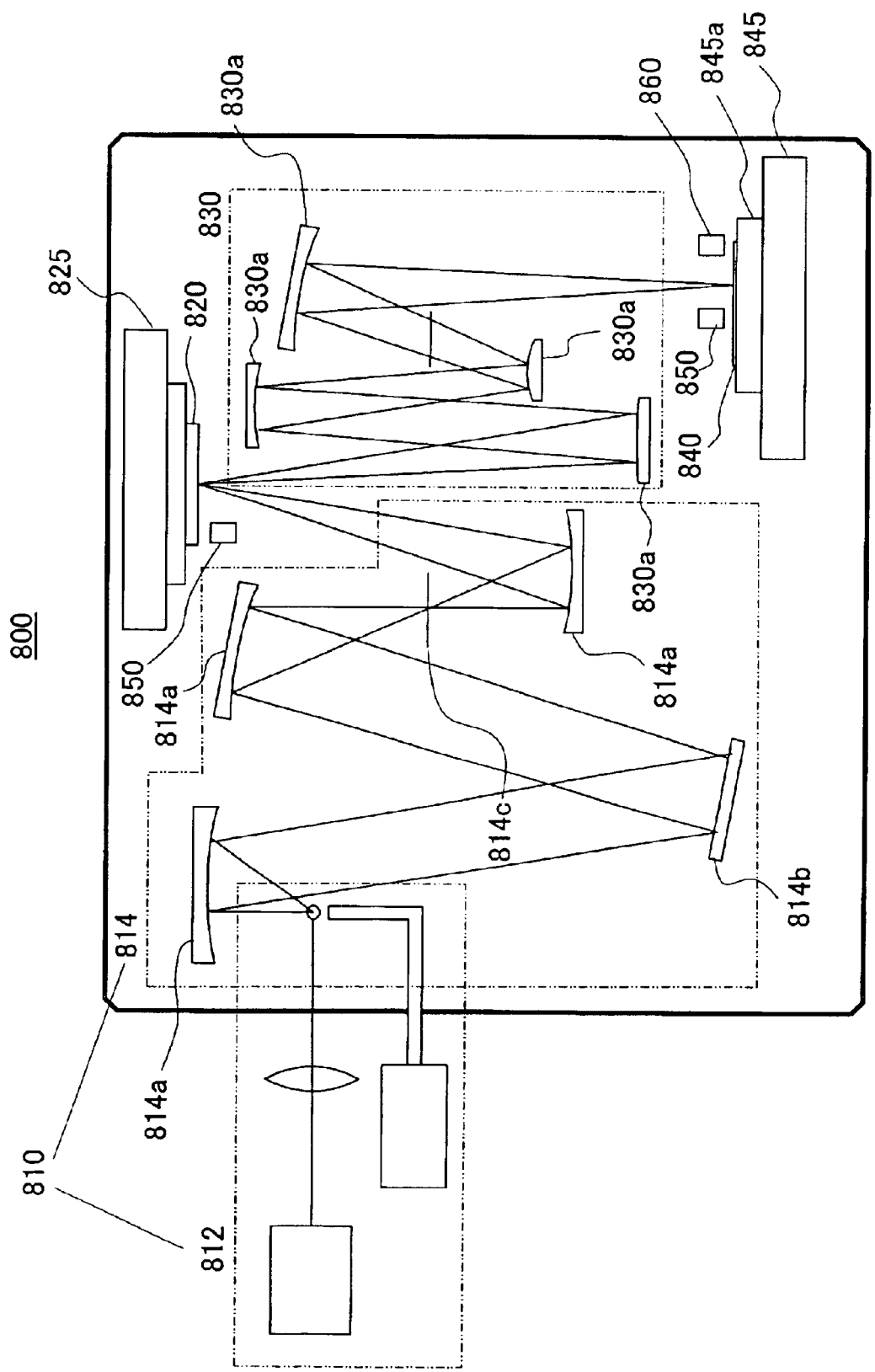
FIG. 20 is a schematic structure of an exposure apparatus of one embodiment according to the present invention.

Referring to FIG. 20, the exposure apparatus 800 includes an illumination apparatus 810, a mask 820, a mask stage 825 that mounts the mask 820, a projection optical system 830, an object to be exposed 840, a wafer stage 845 that mounts the object 840, an alignment detecting mechanism 850, and a focus position detecting mechanism 860.

The illumination apparatus 810 uses arc-shaped EUV light, for example, with a wavelength of 13.4 nm corresponding to an arc-shaped field of the projection optical system 830 to illuminate the mask 820, and includes an EUV light source 812 and illumination optical system 814. The inventive differential pumping system 1 is applicable to a connection between the EUV light source 812 and the illumination optical system 814 of the subsequent stage in the illumination apparatus 810, and the differential pumping system 1 may maintain performance, such as reflectivity of an optical element of the illumination optical system 814 in a low pressure atmosphere for the illumination optical system 814 without damaging use efficiency of the EUV light. The EUV light source 812 may use any of the above structures, and a detailed description will be omitted.

The illumination optical system 814 includes a condenser mirror 814a, an optical integrator 814b, etc. The condenser mirror 814a serves to collect the EUV light that is isotropically irradiated from the laser plasma. The optical integrator 814b serves to uniformly illuminate the mask 820 with a predetermined NA. An aperture to limit the illumination area to an arc shape is also provided.

The mask 820 is a reflection-type mask that forms a circuit pattern or image to be transferred, and supported and driven by the mask stage 825. The diffracted light from the mask 820 is reflected by the projection optical system 830 and projected onto the object 840. The mask 820 and the object 840 are arranged in an optically conjugate relationship. The exposure apparatus 800 is a step-and-scan exposure apparatus, and projects a reduced size of the pattern on the mask 820 on the object 840 by scanning the mask 820 and the object 840.

The mask stage 825 supports the mask 820 and is connected to a moving mechanism (not shown). The mask stage 825 may use any structure known in the art. A moving mechanism (not shown) may include a linear motor etc., and drives the mask stage 825 at least in a direction X and moves the mask 820. The exposure apparatus 800 synchronously scans the mask 820 and the object 840. The exposure apparatus 800 assigns the direction X to scan the mask 820 or the object 840, a direction Y perpendicular to the direction X, and a direction Z perpendicular to the mask 820 or the object 840.

The projection optical system 830 uses plural multilayer mirrors 830a to project a reduced size of a pattern formed on the mask 820 onto the object 840. The number of mirrors is about four to six. For wide exposure area with the small number of mirrors, the mask 820 and object 840 are simultaneously scanned to transfer a wide area that is an arc-shaped area or ring field apart from the optical axis by a predetermined distance. The projection optical system 830 has a NA of about 0.2 to 0.3.

The instant embodiment uses a wafer as the object to be exposed 840, but it may include a spherical semiconductor and liquid crystal plate and a wide range of other objects to be exposed. Photoresist is applied onto the object 840. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

An object to be exposed 840 is held onto the wafer stage 845 by a wafer chuck. The wafer stage 845 moves the object 840, for example, using a linear motor in XYZ directions. The mask 820 and the object 840 are synchronously scanned. The positions of the mask stage 825 and wafer stage 845 are monitored, for example, by a laser interferometer, and driven at a constant speed ratio.

The alignment detection mechanism 850 measures a positional relationship between the position of the mask 820 and the optical axis of the projection optical system 830, and a positional relationship between the position of the object 840 and the optical axis of the projection optical system 830, and sets positions and angles of the mask stage 825 and the wafer stage 845 so that a projected image of the mask 820 may be positioned in place on the object 840.

A focus detection optical system 860 measures a focus position in the direction Z on the object 840 surface, and control over a position and angle of the wafer stage 845 may always maintain the object 840 surface at an imaging position of the projection optical system 830 during exposure.

In exposure, the EUV light emitted from the illumination apparatus 810 illuminates the mask 820, and images a pattern formed on the mask 820 onto the object 840 surface. The instant embodiment uses an arc or ring shaped image plane, scans the mask 820 and object 840 at a speed ratio corresponding to a reduction ratio to expose the entire surface of the mask 820. An adjusted rotational speed of the rotor 614 would adjust the exposure dose required for the object 814. As a result, the exposure apparatus 800 may improve the use efficiency of the EUV light, and reduces the pressure of the subsequent stage to the EUV light source 812 down to the high vacuum state. Thus, the exposure apparatus 800 may maintain the optical performance of the optical element, and provide exposure with good imaging performance and throughput.

Figure 21:
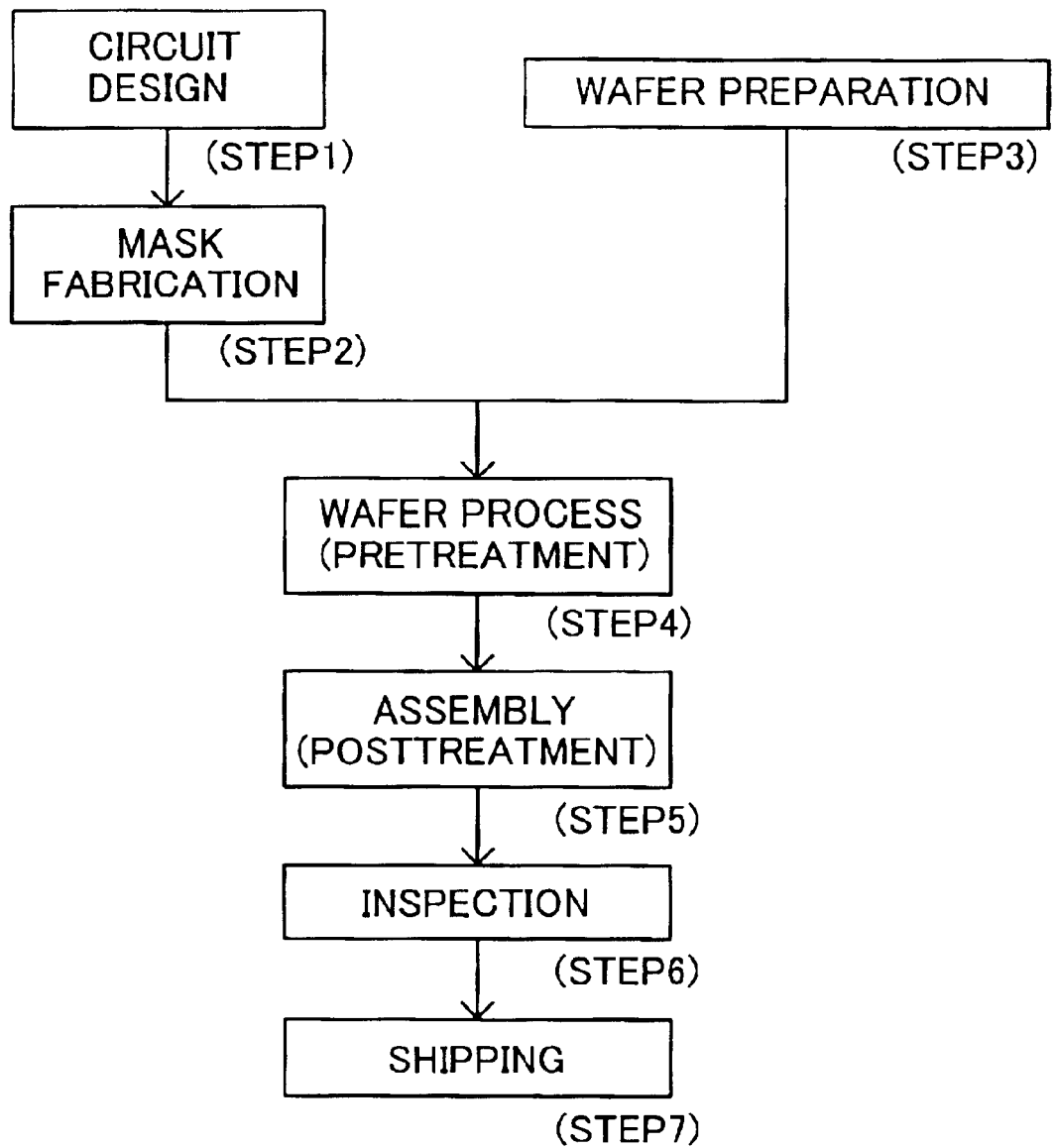
FIG. 21 is a flowchart for explaining how to fabricate devices (such as semiconductor chips such as ICs and LCDs, CCDs, and the like).
Figure 22:
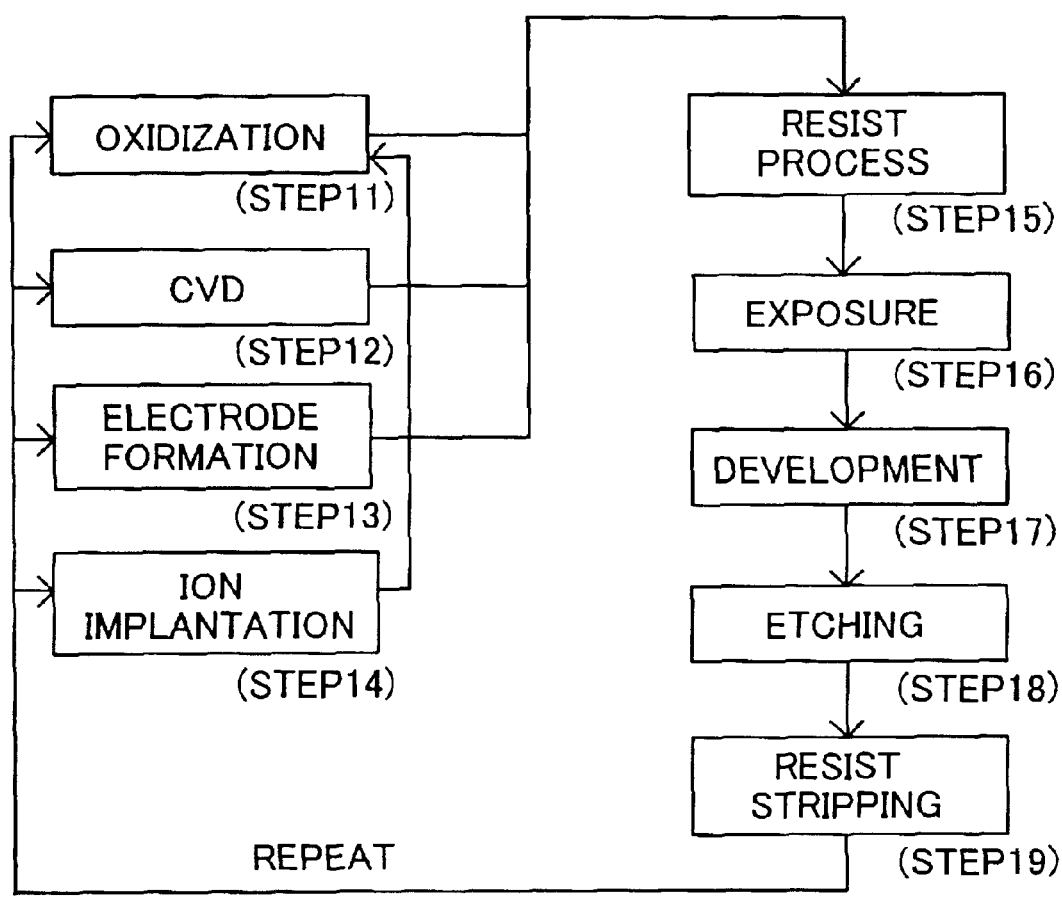
FIG. 22 is a detail flowchart of a wafer process as Step 4 shown in FIG. 21.
Figure 23:
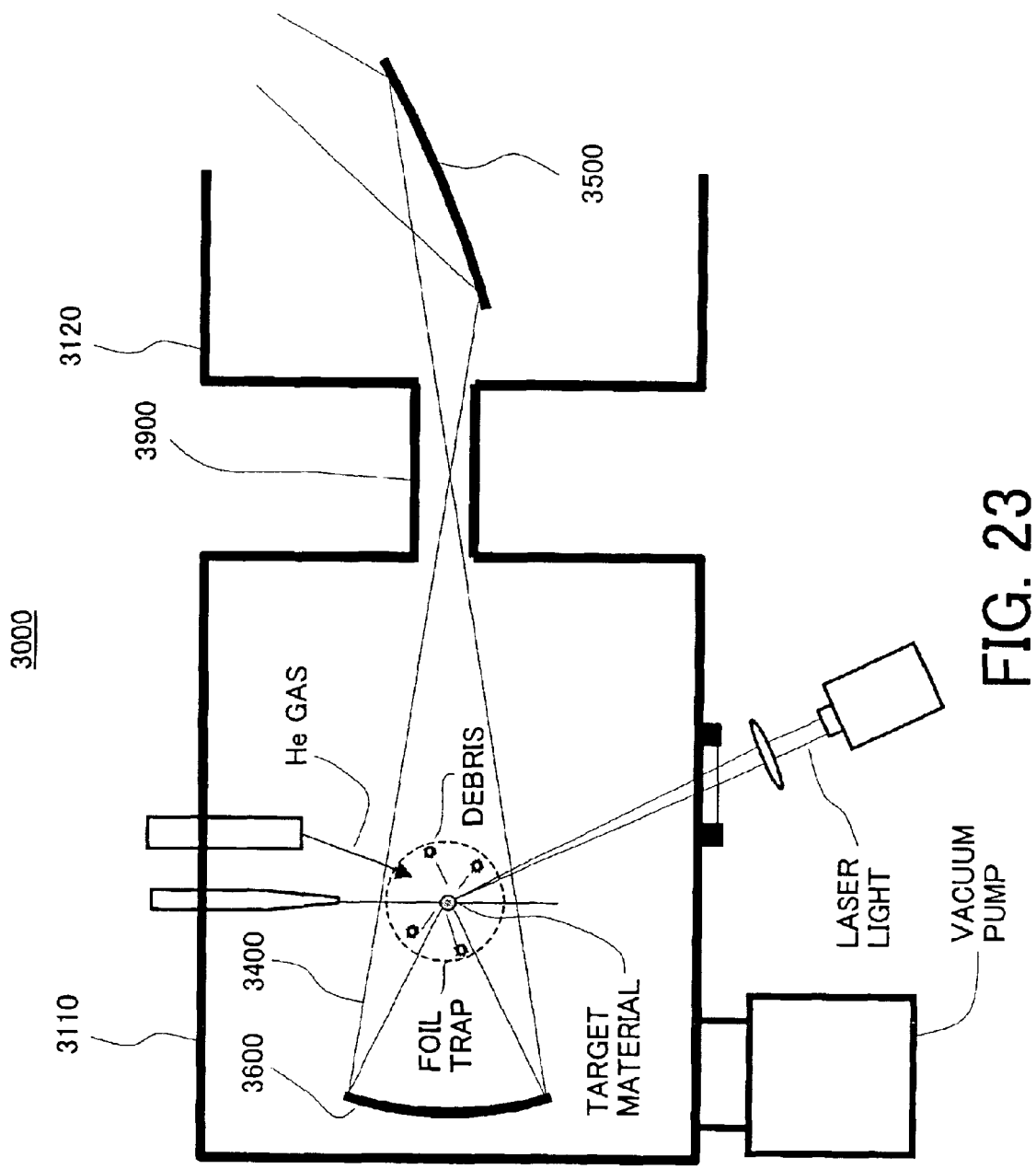
FIG. 23 is a schematic structure of an EUV light source that uses a laser plasma light source.

Referring now to FIGS. 21 and 22, a description will be given of an embodiment of a device fabricating method using the above exposure apparatus 800. FIG. 21 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 22 is a detailed flowchart of the wafer process in Step 4 in FIG. 21. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture a higher quality device than the conventional method. Claims for a device fabrication method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Further, the present invention is not limited to these preferred embodiments, and various variations and modifications may be made without departing from the scope of the present invention.

The present invention may provide a differential pumping system and an exposure apparatus having the same, in which the use efficiency of the high pulsed light is compatible with the differential pumping having a desired pressure difference to maintain performance of an optical element, such as reflectivity.

What is claimed is:

1. A differential pumping system comprising:
   a first chamber for storing a light source that emits pulsed light;
   a first exhaust unit for exhausting said first chamber;
   a second chamber being connectible to the first chamber to receive the pulsed light;
   a second exhaust unit for exhausting said second chamber; and
   a rotator disposed between said first and second chambers, that rotates around an axis, and includes an aperture part through which the pulsed light passes, and a shield part for disconnecting the first chamber from the second chamber; and
   a controller for synchronously controlling emissions of the pulsed light and a rotation of said rotator so that the pulsed beam may pass through the aperture part; and
   a shutter for preventing the pulsed light from entering said rotator when an emission of the pulsed light is not synchronized with a rotation of the rotator.

2. A differential pumping system according to claim 1, wherein said rotator is a disc member that rotates around the axis.

3. A differential pumping system according to claim 1, wherein said rotator is a cylindrical member that rotates around the axis.

4. A differential pumping system according to claim 3, further comprising a third exhaust unit for exhausting the cylindrical member.

5. A differential pumping system according to claim 1, wherein said rotator includes a pattern for detecting a rotational status, and said controller uses the rotational status detected from the pattern.

6. A differential pumping system according to claim 1, wherein the pulsed light is EUV light.

7. An exposure apparatus comprising:
   a differential pumping system includes a first chamber for storing a light source that emits pulsed light, a first exhaust unit for exhausting said first chamber, a second chamber being connectible to the first chamber to receive the pulsed light, a second exhaust unit for exhausting said second chamber, a rotator disposed between said first and second chambers, that rotates around an axis, and includes an aperture part through which the pulsed light passes, and a shield part for disconnecting the first chamber from the second chamber, a controller for synchronously controlling emissions of the pulsed light and a rotation of said rotator so that the pulsed beam may pass through the aperture part, and a shutter for preventing the pulsed light from entering said rotator when an emission of the pulsed light is not synchronized with a rotation of the rotator;
   an illumination optical system that introduces the pulsed light to a mask that forms a circuit pattern to be transferred onto an object; and
   a projection optical system that introduces the light from the mask onto the object,
   wherein said illumination optical system and projection optical system are installed in the second chamber.

8. A measurement apparatus comprising:
   a differential pumping system includes a first chamber for storing a light source that emits pulsed light, a first exhaust unit for exhausting said first chamber, a second chamber being connectible to the first chamber to receive the pulsed light, a second exhaust unit for exhausting said second chamber, a rotator disposed between said first and second chambers, that rotates around an axis, and includes an aperture part through which the pulsed light passes, and a shield part for disconnecting the first chamber from the second chamber, a controller for synchronously controlling emissions of the pulsed light and a rotation of said rotator so that the pulsed beam may pass through the aperture part, and a shutter for preventing the pulsed light from entering said rotator when an emission of the pulsed light is not synchronized with a rotation of the rotator;

a light intensity measuring apparatus for measuring light intensity from an object to be measured;

an illumination optical system that introduces the pulsed light to the object; and a projection optical system that introduces the light from the object to said light intensity measuring apparatus, wherein said light intensity measuring apparatus, illumination optical system and projection optical system are installed in the second chamber.

9. A differential pumping system comprising:

a first chamber for storing a light source that emits pulsed light;

a second chamber being connectible to the first chamber to receive the pulsed light; and a vacuum pump, provided between the first and second chambers, for exhausting an atmosphere of the second chamber toward the first chamber, said vacuum pump including a rotor, wherein the rotor includes an aperture part, through which the pulsed light passes, and wherein the pulsed light is introduced from the first chamber to the second chamber by synchronizing emissions of the pulsed light and a rotation of said rotor.

10. A differential pumping system according to claim 9, further comprising a stator which includes another aperture part through which the pulsed light passes.

11. A differential pumping system according to claim 9, wherein the vacuum pump includes plural rotors arranged in series, and the pulsed light forms light having a focused point, wherein a central rotor among the plural rotors is located at a side from the focused point to the second chamber.

12. A differential pumping system according to claim 9, further comprising a shutter for preventing the pulsed light from entering said rotator when an emission of the pulsed light is not synchronized with a rotation of the rotator.

13. A differential pumping system according to claim 9, wherein the pulsed light is EUV light.

14. An exposure apparatus comprising:

a differential pumping system including a first chamber for storing a light source that emits pulsed light, a second chamber being connectible to the first chamber to receive the pulsed light, and a vacuum pump, provided between the first and second chambers, for exhausting an atmosphere of the second chamber toward the first chamber, said vacuum pump including a rotor, wherein the rotor includes an aperture part, through which the pulsed light passes, and wherein the pulsed light is introduced from the first chamber to the second chamber by synchronizing emissions of the pulsed light and a rotation of said rotor;

an illumination optical system that introduces the pulsed light to a mask that forms a circuit pattern to be transferred onto an object;

a projection optical system that introduces the light from the mask onto the object, wherein said illumination optical system and projection optical system are installed in the second chamber.

15. A measurement apparatus comprising:

a differential pumping system including a first chamber for storing a light source that emits pulsed light, a second chamber being connectible to the first chamber to receive the pulsed light, and a vacuum pump, provided between the first and second chambers, for exhausting an atmosphere of the second chamber toward the first chamber, said vacuum pump including a rotor, wherein the rotor includes an aperture part, through which the pulsed light passes, and wherein the pulsed light is introduced from the first chamber to the second chamber by synchronizing emissions of the pulsed light and a rotation of said rotor;

a light intensity measuring apparatus for measuring light intensity from an object to be measured;

an illumination optical system that introduces the pulsed light to the object;

a projection optical system that introduces the light from the object to said light intensity measuring apparatus, wherein said light intensity measuring apparatus, illumination optical system and projection optical system are installed in the second chamber.

16. A device fabrication method comprising the step of:

exposing an object to be exposed, using an exposure apparatus; and performing a predetermined process for the object exposed, wherein an exposure apparatus includes:
  a differential pumping system includes a first chamber for storing a light source that emits pulsed light, a first exhaust unit for exhausting said first chamber, a second chamber being connectible to the first chamber to receive the pulsed light, a second exhaust unit for exhausting said second chamber, and a connection control mechanism between the first and second chambers for connecting the first chamber to the second chamber when the pulsed light emits, and for disconnecting the first chamber from the second chamber when the pulsed light does not emit;

an illumination optical system that introduces the pulsed light to a mask that forms a circuit pattern to be transferred onto an object;

a projection optical system that introduces the light from the mask onto the object, wherein said illumination optical system and projection optical system are installed in the second chamber.

17. A device fabrication method comprising the step of:

exposing an object to be exposed, using an exposure apparatus; and performing a predetermined process for the object exposed, wherein an exposure apparatus includes:
  a differential pumping system including a first chamber for storing a light source that emits pulsed light, a second chamber being connectible to the first chamber to receive the pulsed light, and a vacuum pump, provided between the first and second chambers, for exhausting an atmosphere of the second chamber toward the first chamber, said vacuum pump including a rotor, wherein the rotor includes an aperture part, through which the pulsed light passes, and wherein the pulsed light is introduced from the first chamber to the second chamber by synchronizing emissions of the pulsed light and a rotation of said rotor;

an illumination optical system that introduces the pulsed light to a mask that forms a circuit pattern to be transferred onto an object;

a projection optical system that introduces the light from the mask onto the object, wherein said illumination optical system and projection optical system are installed in the second chamber.

18. A control method for controlling a rotation of a rotator in a differential pumping system that includes a first chamber for storing a light source that emits pulsed light, a second chamber being connectible to the first chamber and receiving the pulsed light, and the rotator, provided between the first and second chambers, which includes an aperture part through which the pulsed light passes when the pulsed light emits, and a shield part for disconnecting the first chamber from the second chamber when the pulsed light does not emits, said control method comprising the steps of:

dividing a reference clock as a trigger signal of the pulsed light, and generating a reference signal for the rotation of the rotator;

calculating a phase difference signal from the reference signal and a divided signal so that the rotation of the rotator has the same frequency as that of the reference signal;

calculating a phase difference from the reference signal and the phase difference signal; and rotating the rotator so that the phase difference is a phase set value.

19. A differential pumping system comprising:

a first chamber for storing a light source that emits pulsed light;

a first exhaust unit for exhausting said first chamber;

a second chamber being connectible to the first chamber to received the pulsed light;

a second exhaust unit for exhausting said second chamber;

a rotator, disposed between said first second chambers, that rotates around an axis, and includes an aperture part through which the pulsed light passes, and a shield part for disconnecting the first chamber from the second chamber;

a controller for synchronously controlling emissions of the pulsed light and a rotation of said rotator of said rotator so that the pulse beam may pass through the aperture part; and wherein said rotator is a cylindrical member that rotates around the axis.

20. An exposure apparatus comprising:

a differential pumping system includes a first chamber for storing a light source that emits pulsed light, a first exhaust unit for exhausting said first chamber, a second chamber being connectible to the first chamber to receive the pulsed light, a second exhaust unit for exhausting said second chamber, a rotator, disposed between said first and second chambers, that rotates around an axis, and includes an aperture part through which the pulsed light passes, and a shield part for disconnecting the first chamber from the second chamber, a controller for synchronously controlling emissions of the pulsed light and a rotation of said rotator so that the pulsed beam may pass through the aperture part, and wherein said rotator is a cylindrical member that rotates around the axis;

an illumination optical system that introduces the pulsed light to a mask that forms a circuit pattern to be transferred onto an object; and a projection optical system that introduces the light from the mask onto the object, wherein said illumination optical system and projection optical system are installed in the second chamber.

21. A measurment apparatus comprising:

a differential pumping system includes a first chamber for storing a light source that emits pulsed light, a first exhaust unit for exhausting said first chamber, a second chamber being connectible to the first chamber to received the pulsed light, a second exhaust unit for exhausting said second chamber, a rotator, disposed between said first and second chambers, that rotates around an axis, and includes an aperture part through which the pulsed light passes, and a shield part for disconnecting the first chmaber from the second chamber, a controller for synchronously controlling emissions of the pulsed light and a rotation of said rotator so that the pulsed beam may pass through the aperture part, and wherein said rotator is a cylindrical member that rotates around the axis;

a light intensity measuring apparatus for measuring light intensity from an object to be measured;

an illumination optical system that introduces that pulsed light to the object; and a projection optical system that introduces the light from the object to said light intensity measuring apparatus, wherein said light intensity measuring apparatus, illumination optical system and projection optical system are installed in the second chamber.

22. A device fabrication method comprising the steps of:

exposing an object to be exposed, using an exposure apparatus; and performing a predetermined process for the object exposed, wherein said exposure apparatus includes:

a differential pumping system that includes a first chamber for storing a light source that emits pulsed light beam, a first exhaust unit for exhausting said first chamber, a second chamber being connectible to the first chamber to receive the pulsed light, a second exhaust unit for exhausting said second chamber, a rotator, disposed between said first and second chambers, that rotates around an axis, and includes an aperture part through which the pulsed light passes, and a shield part for disconnecting the first chamber from the second chamber, a controller for synchronously controlling emissions of the pulsed light and a rotation of said rotator so that the pulsed beam may pass through the aperture part, and wherein said rotator is a cylindrical member that rotates around the axis;

an illumination optical system that introduces the pulsed light to a mask that forms a circuit pattern to be transferred onto an object; and a projection optical system that introduces the light form the mask onto the object, wherein said illumination optical system and projection optical system are installed in the second chamber.

* * * * *

UNITED STATES PATENT AND TRADEMARK OFFICE
CERTIFICATE OF CORRECTION

PATENT NO. : 6,891,172 B2  
APPLICATION NO. : 10/652690  
DATED : May 10, 2005  
INVENTOR(S) : Nobuaki Ohgushi et al.

It is certified that error appears in the above-identified patent and that said Letters Patent is hereby corrected as shown below:

Column 22, Line 15, change "chmaber" to --chamber--.

Signed and Sealed this

Eighteenth Day of March, 2008

JON W. DUDAS  
*Director of the United States Patent and Trademark Office*